United States Patent
Favero et al.

(10) Patent No.: US 10,520,365 B2
(45) Date of Patent: Dec. 31, 2019

(54) DETECTOR FOR TERAHERTZ ELECTROMAGNETIC WAVES

(71) Applicants: CENTRE NATIONAL DE LA RECHERCHE SCIENTIFIQUE—CNRS, Paris (FR); UNIVERSITE PARIS DIDEROT, Paris (FR)

(72) Inventors: Ivan Favero, Paris (FR); Chérif Belacel, Villejuif (FR); Stefano Barbieri, Paris (FR); Djamal Gacemi, Maisons-Alfort (FR); Yanko Todorov, Paris (FR); Carlo Sirtori, Paris (FR)

(73) Assignees: CENTRE NATIONAL DE LA RECHERCHE SCIENTIFIQUE—CNRS, Paris (FR); UNIVERSITE PARIS DIDEROT, Paris (FR)

( * ) Notice: Subject to any disclaimer, the term of this patent is extended or adjusted under 35 U.S.C. 154(b) by 0 days.

(21) Appl. No.: 16/085,437

(22) PCT Filed: Mar. 16, 2017

(86) PCT No.: PCT/EP2017/056309
§ 371 (c)(1),
(2) Date: Sep. 14, 2018

(87) PCT Pub. No.: WO2017/158130
PCT Pub. Date: Sep. 21, 2017

(65) Prior Publication Data
US 2019/0078938 A1 Mar. 14, 2019

(30) Foreign Application Priority Data
Mar. 16, 2016 (EP) ..................... 16305288

(51) Int. Cl.
*G01J 5/20* (2006.01)
*G01J 5/08* (2006.01)
(Continued)

(52) U.S. Cl.
CPC .......... *G01J 5/0837* (2013.01); *G01J 1/0407* (2013.01); *G01J 3/28* (2013.01); *G01J 5/0803* (2013.01);
(Continued)

(58) Field of Classification Search
CPC ....................................................... G01J 5/20
See application file for complete search history.

(56) References Cited

U.S. PATENT DOCUMENTS

| 5,389,434 A * | 2/1995 | Chamberlain | H01Q 17/004 342/1 |
| 6,986,942 B1 * | 1/2006 | Mayes | B82Y 25/00 428/327 |

(Continued)

FOREIGN PATENT DOCUMENTS

| WO | 2006/055961 A2 | 5/2006 |
| WO | 2006/121920 A2 | 11/2006 |

OTHER PUBLICATIONS

Belacel, C. et al.; "Optomechanical THz detection with a subwavelength resonator"; Apr. 1, 2016; Retrieved from the internet: URL:https://www.researchgate.net/profile/Cherif_Belacel/publication/301926244_Optomechanical_THz_detection_with_a_sub-wavelength_resonator/links/57c52cba08aecd45141565e8/Optomechanical-THz-detection-with-a-sub-wavelength-resonator.pdf?origin=publication_detail (19 pages).

(Continued)

*Primary Examiner* — David P Porta
*Assistant Examiner* — Djura Malevic
(74) *Attorney, Agent, or Firm* — Osha Liang LLP

(57) ABSTRACT

A detector for terahertz electromagnetic waves includes a terahertz optomechanical transducer to transform an inci- (Continued)

dent electromagnetic wave, having a terahertz frequency within a terahertz frequency band, into a measurable mechanical response; and a detection device for detecting an output signal. The terahertz optomechanical transducer includes a first element and an opposite element forming with the first element a capacitive gap.

21 Claims, 18 Drawing Sheets

(51) Int. Cl.
*G01J 1/04* (2006.01)
*G01J 3/28* (2006.01)
*H03C 7/00* (2006.01)
*G01J 5/10* (2006.01)

(52) U.S. Cl.
CPC . *G01J 5/10* (2013.01); *G01J 5/20* (2013.01); *H03C 7/00* (2013.01)

(56) References Cited

U.S. PATENT DOCUMENTS

| | | | | |
|---|---|---|---|---|
| 7,541,584 B2* | 6/2009 | Antoszewski | ............ | G01J 3/02 250/338.1 |
| 7,580,175 B2* | 8/2009 | Aksyuk | ............ | G01J 5/40 250/338.1 |
| 7,705,307 B1* | 4/2010 | Zhao | ............ | G01J 5/08 250/338.1 |
| 7,705,309 B1* | 4/2010 | Jin | ............ | G01J 5/08 250/330 |
| 7,745,790 B2* | 6/2010 | Chowdhury | ............ | B82Y 20/00 250/341.1 |
| 7,826,504 B2* | 11/2010 | Chen | ............ | H03C 7/027 343/700 MS |
| 8,031,991 B2* | 10/2011 | Webster | ............ | G02B 6/1228 385/28 |
| 8,116,602 B2* | 2/2012 | Little | ............ | G02B 6/1228 385/129 |
| 8,309,925 B2* | 11/2012 | Mendis | ............ | H01P 7/06 250/330 |
| 8,648,306 B1* | 2/2014 | Goertz | ............ | H01Q 5/0086 250/340 |
| 8,941,063 B2* | 1/2015 | Tsuchiya | ............ | G01J 5/0225 250/332 |
| 9,040,919 B2* | 5/2015 | Darcie | ............ | G01J 3/0205 250/340 |
| 9,234,797 B1* | 1/2016 | Newman | ............ | G01J 3/28 |
| 9,310,520 B2* | 4/2016 | Owa | ............ | B82Y 20/00 |
| 9,551,655 B2* | 1/2017 | Mazumder | ............ | G01N 21/0303 |
| 9,915,785 B2* | 3/2018 | Lin | ............ | G02B 6/29338 |
| 2006/0284774 A1* | 12/2006 | Salsman | ............ | G01R 23/163 343/703 |
| 2008/0217538 A1* | 9/2008 | Ouchi | ............ | G01N 21/3581 250/338.4 |
| 2008/0309577 A1* | 12/2008 | Mittleman | ............ | G01N 21/3581 343/850 |
| 2009/0027280 A1* | 1/2009 | Frangioni | ............ | A61K 49/0032 343/703 |
| 2009/0134329 A1* | 5/2009 | Kasai | ............ | G01N 21/3581 250/338.1 |
| 2009/0218523 A1* | 9/2009 | Kare | ............ | B82Y 20/00 250/505.1 |
| 2009/0218524 A1* | 9/2009 | Kare | ............ | B82Y 20/00 250/505.1 |
| 2009/0262766 A1* | 10/2009 | Chen | ............ | H03C 7/027 372/26 |
| 2009/0273532 A1* | 11/2009 | Mendis | ............ | H01P 3/12 343/753 |
| 2010/0150512 A1* | 6/2010 | Berini | ............ | G02B 6/122 385/130 |
| 2011/0114856 A1* | 5/2011 | Cooke | ............ | G02F 1/353 250/492.22 |
| 2011/0204231 A1* | 8/2011 | Razansky | ............ | G01J 5/08 250/338.1 |
| 2012/0161005 A1* | 6/2012 | Tsuchiya | ............ | G01J 5/0225 250/338.3 |
| 2012/0261575 A1* | 10/2012 | Averitt | ............ | G01J 3/42 250/332 |
| 2014/0118741 A1* | 5/2014 | Heidrich | ............ | G01N 21/7746 356/402 |
| 2016/0065169 A1* | 3/2016 | Rinaldi | ............ | G01J 5/046 250/338.3 |
| 2016/0099701 A1* | 4/2016 | Rinaldi | ............ | G01J 5/20 422/90 |
| 2017/0131148 A1* | 5/2017 | Hwang | ............ | G01J 5/28 |

OTHER PUBLICATIONS

International Search Report issued in PCT/EP2017/056309 dated Aug. 1, 2017 (3 pages).
Written Opinion issued in PCT/EP2017/056309 dated Aug. 1, 2017 (13 pages).

* cited by examiner

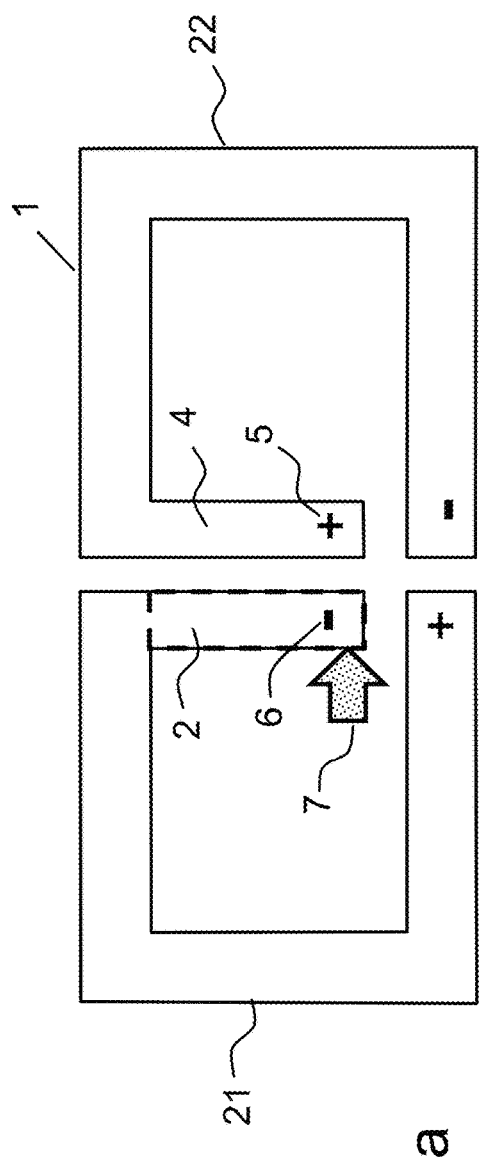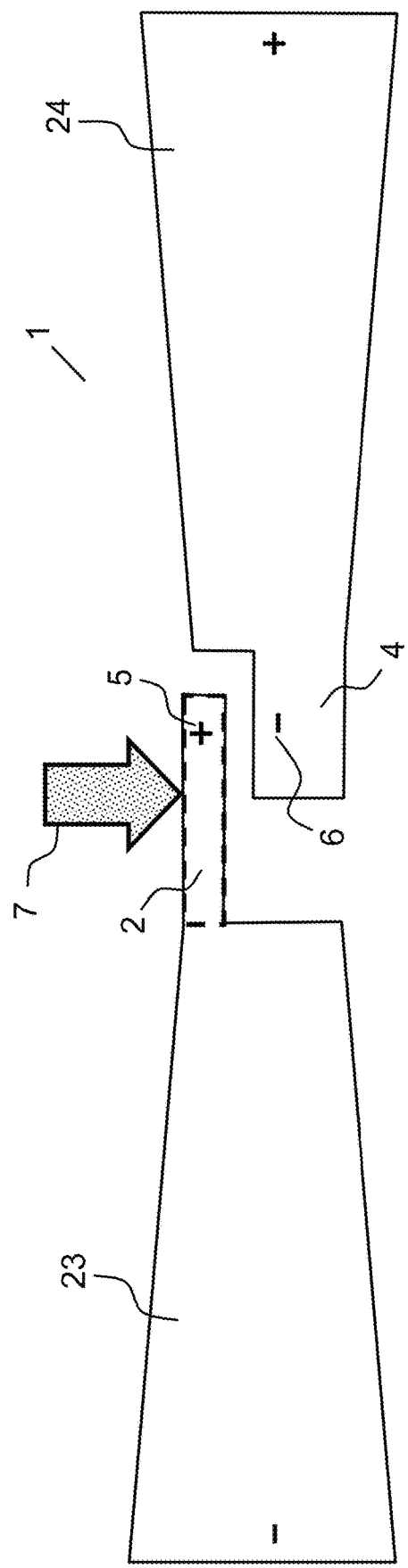

Modulation frequency $f_{mod}$ (MHz)

DETECTOR FOR TERAHERTZ ELECTROMAGNETIC WAVES

TECHNICAL FIELD

The present disclosure relates to a detector for terahertz electromagnetic waves, a method for transducing terahertz electromagnetic waves, and a method for detecting terahertz electromagnetic waves using the detector.

BACKGROUND

Devices using electromagnetic waves having a frequency in the terahertz domain (e.g. from 1 to 100 THz) have important applications, for example in spectroscopy, medicine, security and imaging. These devices include terahertz detectors/transducers operating in the terahertz domain which rely on the conversion of the radiation energy of an incident electromagnetic wave into a measurable form.

For example, in thermal terahertz detectors/transducers, the energy of the incident electromagnetic wave is absorbed and converted into heat. The efficient thermal detection of terahertz electromagnetic waves has technologically developed around two main concepts: bolometers and Golay cells.

As an example, some bolometers convert the energy of the incident electromagnetic wave to heat-up a small resistance made of for example highly doped silicon or germanium. The small change in the resistance value due to the heating is detected by an electrical circuit, i.e. by detecting a bias change on the resistor. These kind of bolometers achieve a minimal detectable power from the detector, in other words a Noise Equivalent Power (NEP) sensitivity of 1 pW/sqrt(Hz) at 4 Kelvins, with a frequency response up to 50 kHz.

In other types of bolometers, the resistance is made of Niobium, which becomes a superconducting material when cooled below a critical temperature of 10 K. Such bolometers are operated just at the superconductor's critical temperature and rely on photon absorption. When a photon is absorbed, the bolometer switches to a normal state and produces a large change in resistance. Such bolometers achieve a Noise Equivalent Power (NEP) sensitivity of 1 pW/sqrt(Hz), with a bandwidth of up to 1 kHz, and operate at a cryogenic temperature of 8 Kelvins.

Other types of bolometers are Indium Antimonide (InSb) bolometers that, in combination with applied magnetic fields and cryogenic operation at a temperature of 4K, achieve detection with NEP=0.5 pW/sqrt(Hz) at frequency up to 500 kHz. All these bolometers, doped silicon or germanium, Niobium, and Indium Antimonide, can be operated in the electromagnetic frequency band 1-20 THz. However, they operate only at cryogenic temperatures (<10K).

In Golay cells, which operate in the range 1-50 THz, the terahertz radiation is transformed into heat thanks to an absorbing element placed within a gas-filled enclosure. The resulting increase in gas pressure pushes a flexible membrane, whose displacement may be detected optically. Being based on thermal effects and thermal distortion of the membrane, the response time is long by comparison with bolometers, but a Golay cell can operate at room temperature. Some commercial Golay cells achieve THz waves detection with 140 pW/sqrt(Hz) of sensitivity, up to a frequency of 20 Hz.

All these techniques have the drawbacks of operating at low temperature, having a long response time, or not operating at all frequencies within the terahertz domain. There is therefore a need for methods or devices allowing electromagnetic waves to be detected or transduced within the entire terahertz domain, at room temperature, with high sensitivity, with short response time, while maintaining the possibilities of miniaturization and integration.

The patent application WO2006/055961A1 discloses a sensor for detecting high frequency signals.

SUMMARY

According to a first aspect, the present description relates to a detector for detecting terahertz electromagnetic waves. The detector comprises at least one first device configured to collect and transform an incident electromagnetic wave, having a terahertz frequency within a terahertz frequency band, into a measurable mechanical response; and a detection device for detecting an output signal. The first device comprising a first element and an opposite element forming with the first element a capacitive gap; said first element being a mechanical resonator having a mechanical resonance frequency and being configured to response mechanically to the action of a force stemming from an electric field, the output signal being representative of the mechanical response of the first element. The electric field is generated between at least one first electric pole induced in said first element, by first electric charges having a first electrical sign, and at least one second electric pole induced in said opposite element, by second electric charges having a second electrical sign opposite to the first electrical sign. The first device is a terahertz optomechanical transducer which is a terahertz electromagnetic resonator made at least of metal, configured to collect the incident terahertz electromagnetic wave and to transform the incident electromagnetic wave into a measurable mechanical response. The terahertz frequency of the incident electromagnetic wave corresponds to the electromagnetic resonance frequency of the terahertz electromagnetic resonator or is in a response frequency bandwidth of the terahertz electromagnetic resonator. The terahertz electromagnetic resonator comprises the first element and the opposite element. The first element and the opposite element comprise each at least an electrically conductive layer which is a metal pattern. The electric field is generated by interaction of said incident electromagnetic wave with electric charges in said terahertz electromagnetic resonator. The first electric charges and the second electric charges alternate in signs between the first and the second electric poles in time at the terahertz frequency of the incident electromagnetic wave.

This detector includes a terahertz (THz) optomechanical transducer that allows to transform an incident electromagnetic wave having a frequency within a terahertz frequency band into a measurable mechanical response. A coupling occurs between the terahertz photons of the incident electromagnetic wave and the mechanical response of the first element. A detection and measurement of the mechanical response may be performed for example by optical or electrical means.

The light-matter interaction occurring in the THz transducer relies on a mutual coupling between the incident electromagnetic waves and the electric charges present in the terahertz electromagnetic resonator. The incident electromagnetic wave interacts in a non-absorptive manner with electric charges present in the terahertz electromagnetic resonator (free carriers that may be present in a metal or superconductor part, or bound charges in parts made of a dielectric), driving them through forces, which are analog to Lorentz forces. The electromagnetic forces induced by the THz electromagnetic wave onto the electromagnetic/mechanical resonator may include radiation pressure effects, optical gradient forces, ponderomotive, electrostrictive, photoelastic forces, and piezoelectric and electrostatic effects. Whatever the electromagnetic forces generated by the THz electromagnetic wave, they do not rely on radiation absorption, and the electromagnetic THz forces can be seen as energy conservative. This is different from the class of bolometers, which rely on radiation absorption. As a first consequence, slow thermal effects originating from absorption of the THz electromagnetic wave do not rule the terahertz electromagnetic resonator operation. This allows the terahertz electromagnetic resonator to operate faster than bolometers, and also to transfer in a non-destructive manner the information carried by the electromagnetic wave onto the mechanical system. As a second consequence, the THz electromagnetic resonance of the transducer can be fixed by design of its geometrical characteristics, rather than the intrinsic physical properties of a constituent material (for instance, the presence of specific absorption bands).

The terahertz electromagnetic resonator is also referred to therein as a terahertz electromagnetic resonator or terahertz resonator.

In one or more embodiment, the first element is a mechanical resonator. The mechanical resonance frequency of this mechanical resonator is much lower, for example in the kHz, MHz or GHZ domain, than the electromagnetic resonance frequency of the terahertz electromagnetic resonator (in the THz domain) and may thus be easily detected, for example using an optical or electrical detection scheme.

According to another aspect, the present description relates to a detector for detecting electromagnetic waves, said detector comprising at least one optomechanical terahertz transducer according to the present disclosure and a detection device for detecting an output signal representative of a mechanical response of a first element of at least one of said optomechanical terahertz transducer.

The detector acts as a compact and efficient detector for THz electromagnetic waves. It operates at room temperature with a high frequency response (>1 MHz), well beyond the speed of Golay cells, pyroelectric detectors and cryogenic semiconductor bolometers. These properties make it an ideal detector for applications that rely on high speed bright sources such as synchrotrons or THz Quantum Cascade lasers.

In contrast with the prior art device disclosed in the patent application WO2006/055961A1 in which the electrostriction effect is the only effect which is used, there is no electrostriction effect (or this effect is negligible compared to the quasi-static Coulomb THz forces) in the electromagnetic/mechanical resonator disclosed therein. Further, in contrast again with this prior art device, no external electrical device (electrode, voltage generator, electrical device applying an external electrical field, etc) is necessary to produce an electrical field and a mechanical response of a first element. Especially, in the terahertz electromagnetic resonator disclosed therein, the electrical poles, and therefore the electrical field between these poles, are induced by the action of the THz electromagnetic wave on the electric charges in the terahertz electromagnetic resonator and the first element mechanically reacts (e.g. moves or deforms) naturally under the sole effect of the electromagnetic THz forces.

According to a second aspect, the present description relates to method for detecting an incident electromagnetic wave having a terahertz frequency within a terahertz frequency band of use. The method may use a detector according to the first aspect. The method comprises: transforming an incident electromagnetic wave having a terahertz frequency within a terahertz frequency band of use, into a measurable mechanical response; detecting an output signal representative of said mechanical response by the detection device of the detector, the amplitude of the output signal being proportional to the intensity of said incident electromagnetic wave. The step of transforming the incident electromagnetic wave into a measurable mechanical response comprises: collecting the incident electromagnetic wave by the terahertz optomechanical transducer of the detector, wherein the terahertz frequency of the incident electromagnetic wave corresponds to the electromagnetic resonance frequency of the terahertz electromagnetic resonator or is in a response bandwidth of the terahertz electromagnetic resonator; producing a mechanical response of the first element by action of a force stemming from an electric field generated by interaction of said electromagnetic wave on electric charges present in said terahertz electromagnetic resonator, wherein said electric field is generated between a first electric pole induced in said first element, by first electric charges having a first electrical sign and a second electric pole induced in said opposite element, by second electric charges having a second electrical sign opposite to the first electrical sign, and wherein the first electric charges and the second electric charges alternate in signs between the first and the second electric poles in time at the terahertz frequency of the incident electromagnetic wave.

BRIEF DESCRIPTION OF THE DRAWINGS

Other advantages and characteristics of the disclosed devices and methods will become apparent from reading the description, illustrated by the following figures, where:

FIGS. 3a and 3b represent schematically other embodiments of a THz optomechanical transducer;

FIG. 6a is a top view slightly in perspective of the embodiment and FIG. 6c is a top view of the embodiment;

In the Figs., identical elements are indicated by the same references.

DETAILED DESCRIPTION

Figure 1A:
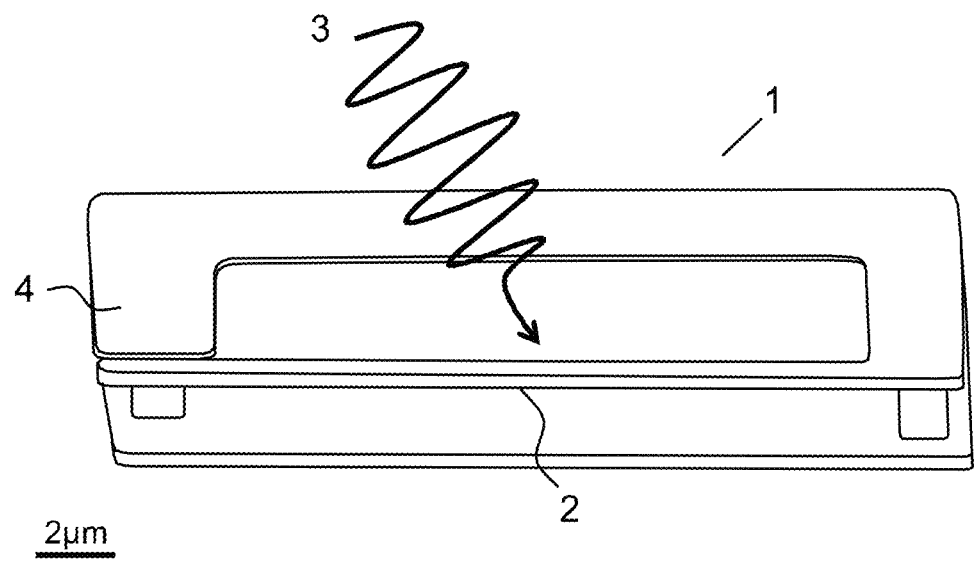
FIGS. 1a and 1b represent schematically an embodiment of a THz optomechanical transducer.

Several embodiments of a terahertz optomechanical transducer for transducing an incident electromagnetic wave having a frequency within a terahertz frequency band will be described in detail by reference to the figures. The terahertz frequency band (also referred to therein as the THz domain) comprises at least the frequency band between 1 THz and 100 THz.

The terahertz optomechanical transducer comprises an electromagnetic resonator having a response bandwidth including the frequency of the incident electromagnetic wave to be transduced.

The terahertz optomechanical transducer may be used with an incident electromagnetic wave whose frequency corresponds to an electromagnetic resonance frequency of the electromagnetic resonator, or which is in a response bandwidth of the electromagnetic resonator in which the electromagnetic resonator collects the incident electromagnetic wave and the electric field is generated under the action of the collected incident electromagnetic wave.

The response bandwidth of the electromagnetic resonator comprises the electromagnetic resonance frequency (usually the center frequency of the response bandwidth), and its width is determined by the quality factor of the electromagnetic resonator.

In one or more embodiments, the geometric characteristics e.g. form and dimensions of the electromagnetic resonator are chosen so that its fundamental electromagnetic resonance mode has a frequency in the THz domain. Exemplary embodiments with different forms and dimensions are disclosed therein.

For example, the electromagnetic resonator may be a split hollow resonator, a split ring resonator, an antenna (e.g. spiral antenna, bow-tie antenna, half-wavelength antenna . . . ), a combination of such antennas, a combination of such antennas with a planar resonator, a resonator that is made of a multilayered structure with several metallic parts and insulating layers, such as a metamaterial resonator.

In one or more embodiments, the electromagnetic resonator has a split hollow form, for example the form of a split-ring (see for example FIGS. 1a, 1b), symmetric or asymmetric. In one or more embodiments, the electromagnetic resonator has the form of a dog-bone, an antenna (see for example FIG. 2 or 3b), a Jerusalem cross, a planar resonator or is a combination of different pieces having such forms, for example a double split-ring (see for example FIG. 3a).

In one or more embodiments, the electromagnetic resonator is made of one or more materials comprising free electric charges or where electric charges may be excited (or activated) under the action of an incident electromagnetic wave having a frequency in the THz domain.

For example, at least one part of the electromagnetic resonator is made of a dielectric material or a piezoelectric material, and the electric charges may be activated (or excited) in that part by the incident electromagnetic wave.

For example, at least one part of the electromagnetic resonator is made of a metal or a doped semiconductor material, and the electric charges may be displaced in that part by the incident electromagnetic wave.

In one or more embodiments, the electromagnetic resonator is of inductive-capacitive type. The electromagnetic resonator may comprise a first element and an opposite element forming with the first element a capacitive gap of the electromagnetic resonator. The capacitive gap stores the electric field that is responsible for the mechanical response, but, together with the inductive element, the capacitive gap can also define the THz electromagnetic resonance as in the case of an inductor-capacitor electrical circuit.

The electromagnetic resonator allows collecting and converting an incident electromagnetic wave having a frequency within the THz domain into a measurable mechanical response of an element of the electromagnetic resonator. The structure resonating devices disclosed herein behaves both as an electromagnetic and mechanical resonator.

In one or more embodiments, the device (terahertz optomechanical transducer) has one electromagnetic resonator (in this case, this resonator also contains the resonating mechanical element), or two or more electromagnetic resonators coupled together (in this case, at least one of these electromagnetic resonators also contains the resonating mechanical element). Each electromagnetic resonator has its own electromagnetic resonance frequency, but a structure resonating device, including different electromagnetic resonators, has its own electromagnetic resonance frequency.

The detector may comprise several optomechanical transducers, some optomechanical transducers having different resonance terahertz frequency (for detecting different terahertz frequency, each optomechanical transducer having different form or dimensions from the others), some optomechanical transducers having same resonance terahertz frequency.

The detector comprises both a THz electromagnetic resonator and a mechanical resonator. This double resonator is also referred to therein as an electromagnetic/mechanical resonator. This makes it possible to co-localize the THz wave and the mechanical resonance mode into the physical volume of the electromagnetic/mechanical resonator. This allows an optimal coupling between the THz wave and the mechanical response of the mechanical resonator. Consequently, the electromagnetic/mechanical resonator efficiently transduces the THz wave into a mechanical response.

The mechanical response is for example a mechanical deformation (e.g. a flexion, a twist, and/or a torsion), a movement or displacement, a vibrational motion of a mechanically responsive element of the electromagnetic resonator or a piezoelectric strain in the mechanically responsive element of the electromagnetic resonator.

For example, the mechanically responsive element that belongs to the electromagnetic resonator (which is one element of the electromagnetic resonator and which is hence sensitive or responsive to the terahertz wave) is a mechanically deformable element (e.g. flexible element, twistable element) or a movable element.

In one or more embodiments, the mechanical response is a shift of the mechanical equilibrium position of the element.

In at least one embodiment, the mechanical response is a micromechanical movement of the mechanically responsive element of the electromagnetic resonator.

In one or more embodiments, the mechanically responsive element is a wire, a lever, a membrane, a disk, a plate, a pillar, a post, an array, a torsional system, a ring, a rectangular patch, a circular patch, a bulk mode mechanical system, a contour mode mechanical system, a bulk acoustic wave resonator, a tuning fork, a surface acoustic wave resonator.

In one or more embodiments, at least one element of the elements forming capacitive gap is mechanically responsive (or mechanically reactive) to the action of the force stemming from the electric field generated by an interaction of the incident electromagnetic wave with the electric charges in the electromagnetic resonator, the electric field being localized in the capacitive gap.

The mechanical response may be a mechanical or a movement of the first element of the capacitive gap in the direction of the opposite element of the capacitive gap. The mechanically responsive element may have a fixed extremity and movable or flexible extremity (see for example FIGS. 1a, 1b, 2, 3a, 3c). The mechanically responsive element may have at least two fixed extremities and a movable or flexible part between the fixed extremities. The flexible part of the mechanically responsive element may further be suspended over a substrate.

Depending on the materials used for the electromagnetic resonator, the electric charges may be free electric charges that are displaced under the action of the electromagnetic wave or bound electric charges that are activated (or excited) under the action of the electromagnetic wave. The moved or activated electric charges may be positive charges or negative charges. The electric charges are activated or displaced so as to generate at least one pair of electric poles of opposite signs in the electromagnetic resonator. The two electric poles forming the electric field have opposite signs (a positive pole and a negative pole).

In one or more embodiments, the electric field is generated between a first electric pole induced in the first element by first electric charges having a first electrical sign, and a second electric pole induced in said opposite element by second electric charges having a second electrical sign opposite to the first electrical sign.

In one or more embodiments, at least one element forming the capacitive gap is a mechanical resonator and the mechanical response induced by forces stemming from the electric field is a vibrational motion. The mechanical resonator may be of small dimensions, typically between the millimeter and nanometer range, in order to have a fast mechanical response and a small inertial mass enabling an efficient mechanical response to the forces induced by the incident electromagnetic wave.

This mechanical resonator has its own mechanical resonance frequency, which may be for example in the kHz domain, the MHz domain, or the GHz domain.

In at least one embodiment, the intensity of the incident electromagnetic wave is modulated at the mechanical resonance frequency of the mechanical resonator or is modulated at a frequency in the response bandwidth of the mechanical resonator, and at least one of the elements forming the capacitive gap is made to vibrate. In at least one embodiment, the mechanical response of the element of the capacitive gap is a shift of the mechanical resonance frequency of this element.

The amplitude of the mechanical response (e. g. deformation, movement or vibration) of the mechanically responsive element of the electromagnetic resonator is directly related to the intensity of the incident electromagnetic wave and may be proportional to the intensity of the incident electromagnetic wave.

The electromagnetic resonator may be made of one or more path-connected or electrically-connected parts.

In one or more embodiments (see for example FIGS. 1a and 1b), the terahertz electromagnetic resonator is made of a single electrically-connected part, wherein the mechanically responsive element and the opposite element form two ends of the electrically-connected part. One part of the electromagnetic resonator may be said to be an electrically-connected part or a continuous electrically-connected part when electric charges present in one point of the electrically-connected part may be displaced to any other point of the electrically-connected part.

In one or more embodiments (see for example FIG. 3a), the terahertz electromagnetic resonator is made of at least two continuous electrically-connected parts which are electrically separated, the mechanically responsive element forming an end of a first electrically-connected part and the opposite element forming an end of another electrically-connected part. In this embodiment, the terahertz resonator comprises at least two continuous electrically-connected parts which present each an electrical metal conductive layer, the electrical metal conductive layers are electrically separated, one pair of electric pole per continuous electrically-connected part, at least one electric pole of a continuous electrically-connected part facing another electric pole of another continuous electrically-connected part.

In one or more embodiments, the first element is a mechanical resonator and it is clamped between the electric poles. The mechanical element is clamped/held between the two poles of capacity. For example, in the case where the first element is a mechanical disk, the two electrodes are placed on the base and the top of the disk, the mechanical action is the deformation of the disk.

Different embodiments will now be described in detail.

Figure 1B:
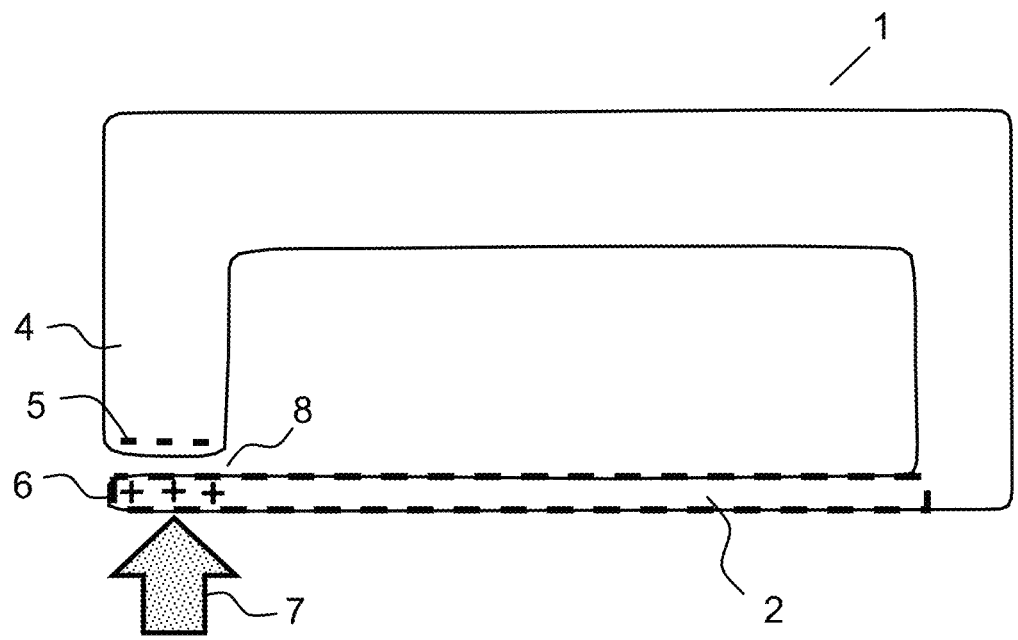

FIGS. 1a and 1b illustrate an exemplary embodiment of a terahertz optomechanical transducer comprising an electromagnetic resonator having the form of an asymmetric split ring, which is referred to therein as a split ring resonator (SRR). The electromagnetic resonator 1 has a response bandwidth including the frequency of the incident electromagnetic wave 3 to be transduced.

The terahertz electromagnetic resonator comprises four metal-coated branches that together form an electromagnetic inductance. One branch is narrower than the 3 others: this branch is a deformable cantilever that forms the mechanically responsive element 2 of the electromagnetic resonator. At its apex, it is separated from a nearby branch 4 (or opposite element 4) by a capacitive gap 8. The narrow branch is under-etched in order to be freely suspended over the substrate. The opposite element 4 may be at least partially in contact with the support, and the deformable element 2 projects entirely outwards the support. The mechanically responsive element 2 is a deformable element that has a fixed extremity and a free flexible extremity in which an electric pole may be formed.

The deformable element 2 and the opposite element 4 forming the capacitive gap comprise each a support layer and an electrically conductive layer (for example the same metal layer) resting on the support layer. For example, the electromagnetic resonator may be made by depositing a metal pattern (which is the electrically conductive layer) on a support like a GaAs/AlGaAs layered semiconductor structure.

In one or more embodiments, the use of the metal for the first element and the opposite element allows confining the electric energy density in a very small volume (with a distance on the order of 100 nm for instance between two electric poles), and thus achieving a very high quasi-static Coulomb force.

In one or more embodiments, the mechanical action induced by the THz wave is triggered by the Coulomb attractive force that exists between two electrical poles with opposite signs. These poles are induced within the resonator when the latter is excited by an incident THz radiation. As the Coulomb force decreases with the distance between the poles, the resonators may be designed in such a way that this distance is minimal. Thus, the electric field that is induced between the two electrical poles is localized and concentrated in a very short distance and, at the same time, it has a very high amplitude. Such electric fields can be achieved in metallic resonators. For instance, in a split ring metallic resonator, there are two electrical poles that form around the slit of the resonator, when the latter is excited by an incident THz wave. At the same time, 90% of the electric energy density is localized around the slit. The Coulomb force between the poles is thus inversely proportional to the opening of the slit, which is typically between 10 nm and 10 micrometers.

This dimension of the perimeter of the SRR fixes the resonant wavelength $\lambda_{res}$ of the electromagnetic mode in the case of such a split ring resonator. Typically, for the SRR, the perimeter of the split hollow form is equal to $\lambda_{res}/2n$ and n is the average refractive index between the indices of the support material, the resonator material and the air.

The electric field is generated under the action of the electromagnetic wave collected by the electromagnetic resonator between a first pole generated in the deformable element 2 and a second pole generated in the opposite element 4. The deformable element is deformable under the action of a force stemming from the electric field generated between two poles 5, 6 of opposite signs generated by interaction of the incident electromagnetic wave 3 with electric charges in the electromagnetic resonator, for example in the metal layer of the electromagnetic resonator. For example, the deformable element 2 moves in direction of the opposite element 4 under the action of the force stemming from an electric field generated between the two poles 5, 6.

In one or more embodiments, the deformable element or cantilever 2 is a mechanical resonator. By using standard semiconductor etching technology, the narrow arm of the resonator may be processed into a cantilever with a high aspect ratio between length and width and/or length and thickness, typically over 10, for example a width between 100 nm and 1 µm, typically 581 nm, a thickness between 100 nm and 1 µm., typically 470 nm and a length between 1 µm and 100 µm, typically 17.2 µm length. The thickness of the cantilever may be small enough for the cantilever to be flexible under the action of a THz power circulating in the resonator of at least 1 nW. The cantilever may present a suspended length, corresponding to the flexible part of the cantilever, which is superior to 8 times the width of the cantilever. The width of the capacitive gap may be between 10 nm and 1 µm, typically 309 nm of the resonator of the FIG. 1a or 1b.

Further, the weight or inertial mass of the cantilever may be small enough (for example below 1 µg) so that the cantilever is flexible under the action of an electric field created in the capacitive gap.

In one or more embodiments, the intensity of the incident electromagnetic wave is modulated at the mechanical resonance frequency in a response bandwidth of the mechanical resonator and the deformable element 2 is made to vibrate by action of the force stemming from the electric field generated by interaction of the incident electromagnetic wave with electric charges in the electromagnetic resonator.

The modulation signal applied to the incident electromagnetic wave by modulation means (e.g. a modulator, electronic modulation circuit or chip, etc), may be a rectangular signal (e.g. ON/OFF signal), a sinusoidal signal or any periodically oscillating signal having a main frequency component in a response bandwidth of the mechanical resonator. Under the effect of this modulation, the force stemming from the electric field is periodically changed with a typical frequency close to mechanical resonance. Note, however that the electric charges alternate (from positive to negative sign, or, respectively from negative to positive sign) at a much higher frequency that is the THz electromagnetic resonance frequency of the structure.

For example, in the embodiment of FIG. 1a or 1b, the cantilever is a mechanical resonator that vibrates and deflects, with both in-plane and out of plane flexural modes. When the displacement is in the plane, the gap distance and the associated capacitance are modulated.

The THz optomechanical transducer 1 may thus be compared to a LC circuit oscillating at its fundamental electromagnetic resonance frequency and that can store electrical energy.

A capacitor stores energy in the electric field between its plates, depending on the voltage across it, and an inductor stores energy in its magnetic field, depending on the current through it. If an inductor is connected across a charged capacitor, current will start to flow through the inductor, building up a magnetic field around it and reducing the voltage on the capacitor. Eventually all the charges on the capacitor will be gone and the voltage across it will reaches zero. However, the current will persist, because inductors resist changes in current. The current will begin to charge the capacitor with a voltage of opposite polarity to its original charge. When the magnetic field is completely dissipated the current will stop and the charges will again be stored in the capacitor, with the opposite polarity as before. Then the cycle will start again, with the current flowing in the opposite direction through the inductor. The charge flows back and forth between the plates of the capacitor, through the inductor. The energy oscillates back and forth between the capacitor and the inductor until (if not replenished from an external circuit) internal dissipation makes the oscillations die out. Thus, the electrical sign of the poles alternates.

Referring back to the embodiment of FIGS. 1a and 1b, the electric sign of the electric charges forming the first pole in the deformable element 2 and the electric sign of the electric charges forming the second electric pole in the opposite element alternate in time at the frequency of the incident wave in a synchronous manner so that the electric sign of the electric charges forming the first pole in a first element is always opposite to the electric sign of the electric charges forming the second pole in the opposite element. The action of the electric force stemming from the electric field generated by the two opposite poles is thus maintained on the deformable element 2 during the pole alternation.

In one or more embodiments, the dimensions of the electromagnetic resonator are chosen so that its fundamental electromagnetic resonance mode is in the THz domain. When this fundamental electromagnetic resonance mode is excited by the incident electromagnetic wave 3, a dynamic distribution of electric charges with opposite signs 5, 6 appears on both sides of the capacitive gap 8, as illustrated by FIG. 1b. This also results in a force 7 on the deformable element 2 that attracts the deformable element 2 towards the opposite element 4 of the capacitive gap and sets the deformable element 2 into motion.

Figure 2:
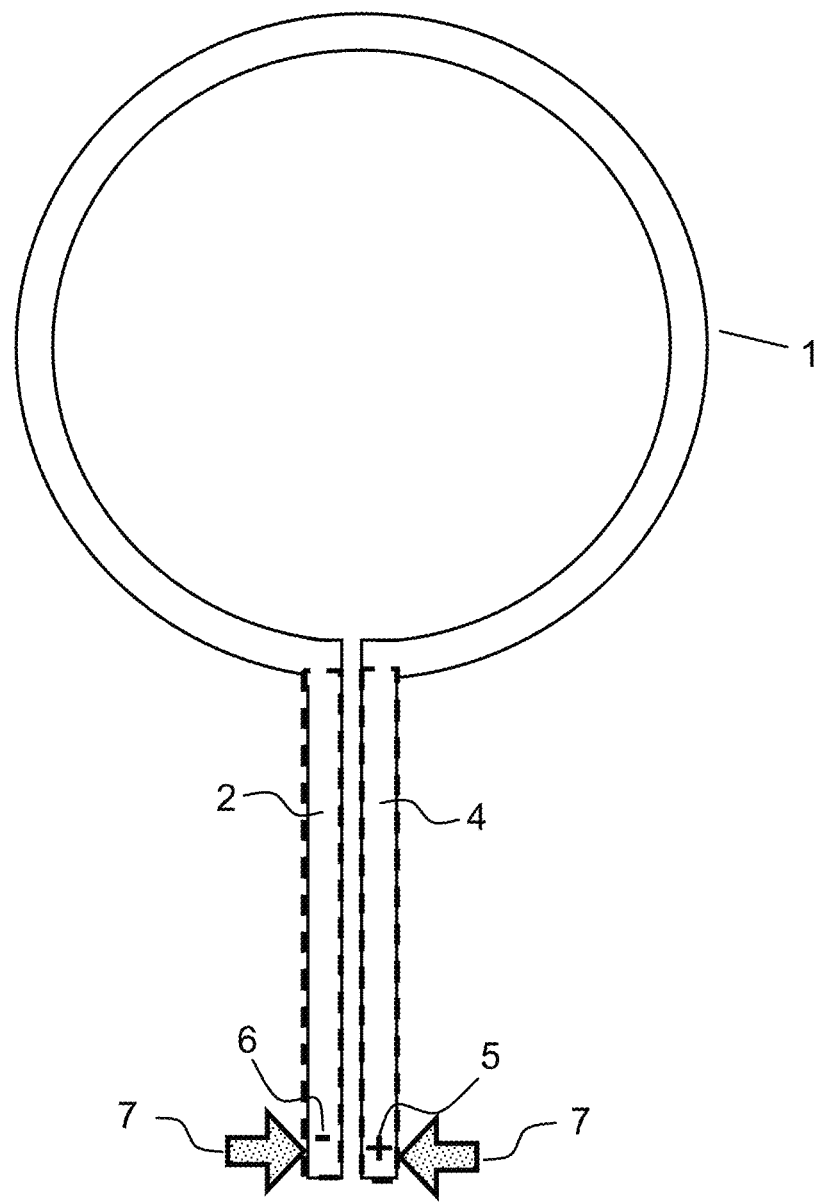
FIG. 2 represents schematically another embodiment of a THz optomechanical transducer.

In one or more embodiments, the deformable element and the opposite element are located at two opposite ends of a continuous electrically-connected part of the electromagnetic resonator as illustrated in FIGS. 1a, 1b and 2.

FIG. 2 illustrates an embodiment of an electromagnetic resonator which is a tuning fork. The first element 2 and the opposite element 4 may include at least a same metal layer (which can rest on a support layer in a dielectric material for instance), and may be both mechanically responsive to the action of forces stemming 7 from the electric field generated by interaction of said incident electromagnetic wave with electric charges in said electromagnetic resonator. Each of the first element 2 and the opposite element 4 are mechanically responsive and may move toward the other under the action of the electric field. Both the first element 2 and the opposite element 4 may be made to vibrate synchronously (at the same frequency and with the same amplitude, but in opposite directions) when the incident electromagnetic wave is modulated at an appropriate frequency.

In the embodiments illustrated by FIGS. 3a, 3b and FIGS. 4a, 4b, the deformable element 2 and the opposite element 4 are located at two opposite ends of two distinct electrically-connected parts of the electromagnetic resonator, and may include each a different metal layer. The two electrically-connected parts are electrically separated or electrically disconnected one from the other in such a way that electric charges present in one electrically-connected part cannot be displaced to the other electrically-connected part.

In the embodiment illustrated by FIG. 3a, the electromagnetic resonator is made of a double split ring having a single electromagnetic resonance. This kind of electromagnetic resonator is symmetric. The first split ring 21 is a first electrically-connected part of electromagnetic resonator and the second split ring 22 is a second electrically-connected part of electromagnetic resonator, the first element 2 being formed at the end of the first split ring 21 and the opposite element 4 being formed at the end of the second split ring 22.

In one or more embodiments, the first split ring 21 considered alone (without the second split ring 22 in the vicinity) has its own terahertz electromagnetic resonance, and the second split ring 22 (without the first split ring 21 in the vicinity) has its own terahertz electromagnetic resonance. As explained before, when the first split ring and the second ring are coupled together, they have a single terahertz electromagnetic resonance.

In one or more embodiments, in the case of two or more terahertz electromagnetic resonators, one terahertz electromagnetic resonator having its own terahertz electromagnetic resonance comprises a first movable element 2, and another terahertz electromagnetic resonator having its own terahertz electromagnetic resonance comprises an opposite element 4 situated in front of the first element 2. When these resonators are coupled together for forming an electromagnetic resonator having its own terahertz electromagnetic resonance, the first element 2 and the opposite element 4 are mechanically responsive and may move toward the other under the action of the electric field generated by interaction of said incident electromagnetic wave with electric charges in the electromagnetic resonator at the electromagnetic resonance frequency.

A first pair of electric poles of opposite signs are induced in the first element 2 by the action of the electromagnetic wave on the electric charges in the electromagnetic resonator. A second pair of electric poles of opposite signs are induced in the opposite element 24 by the action of the electromagnetic wave on the electric charges in the electromagnetic resonator. The electric field 7 is generated between a first electric pole 6 of the first pair of poles generated in the first element 2 and a second electric pole 5 of the second pair of poles generated in the opposite element 6. Because of the symmetry of the electromagnetic resonator, the induced charge distribution is quadripolar and the radiative losses are minimized.

FIG. 3b illustrates an embodiment of an electromagnetic resonator in form of an antenna in two parts 23, 24, each part being an electrically-connected part of the electromagnetic resonator. The first electrically-connected part 23 comprises the first element 2 which is mechanically responsive and the other electrically-connected part 24 comprises the opposite element 4. The electric field 7 is generated between a first electric pole 6 generated in the first element 2 and a second electric pole 5 generated in the opposite element 4.

Figure 4A:
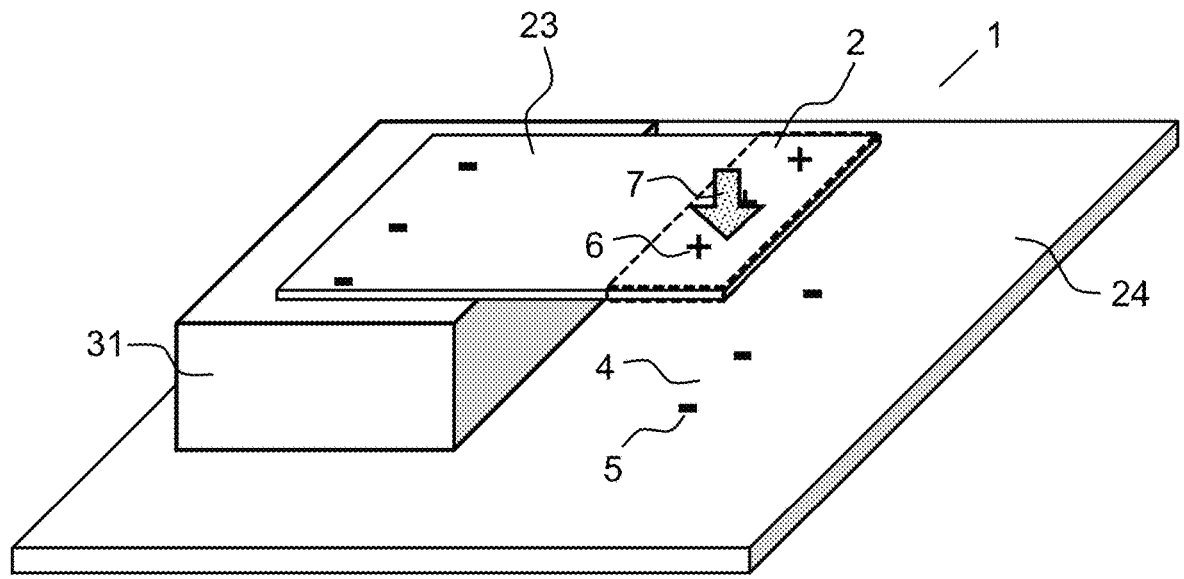
FIGS. 4a and 4b represent schematically other embodiments of a THz optomechanical transducer.
Figure 4B:
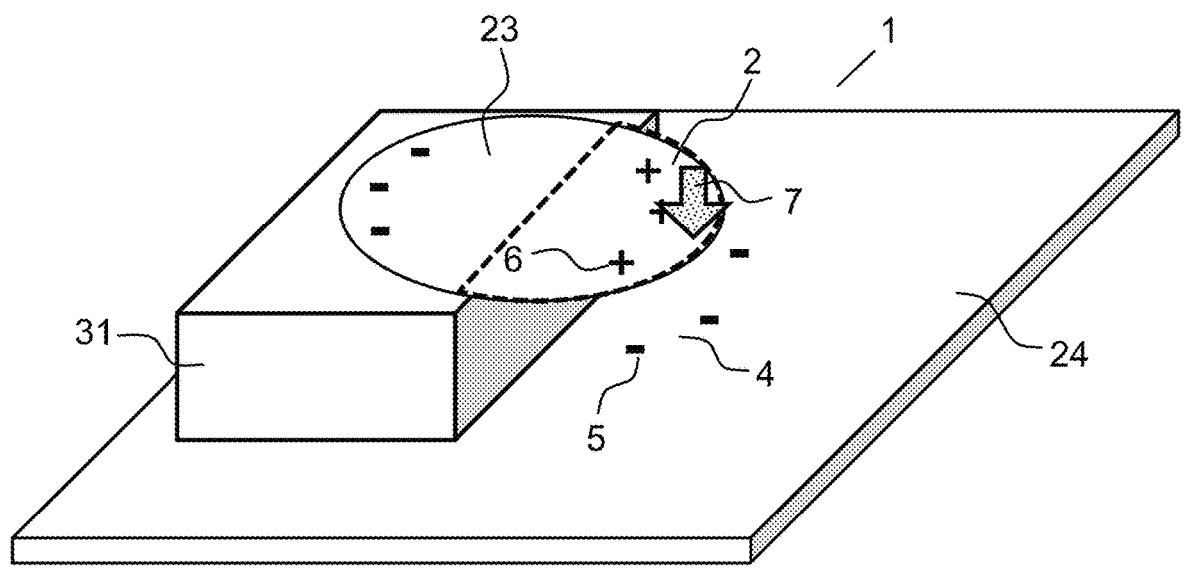

FIGS. 4a and 4b illustrate an embodiment of an electromagnetic resonator in form of a planar antenna, the two-path connected parts 23, 24, which may be for example made of metal, being in two different planes separated by a dielectric layer 31 to electrically isolate the two electrically-connected parts. The first electrically-connected part 2 of FIG. 4a, respectively 4b, is a rectangular patch, respectively a circular patch. The first electrically-connected part 23 comprises the first element 2 which is mechanically responsive and the other electrically-connected part 24 comprises the opposite element 4.

A first pair of electric poles of opposite signs are induced in the first element 2 by the action of the electromagnetic wave on the electric charges in the electromagnetic resonator. A second pair of electric poles of opposite signs are induced in the opposite element 4 by the action of the electromagnetic wave on the electric charges in the electromagnetic resonator. The electric field 7 is generated between a first electric pole 6 of the first pair of electric poles generated in the first element 2 and a second electric pole 5 of the second pair of electric poles generated in the opposite element 4, the two electric poles forming the electric field having opposite signs.

The electric field between the pair of opposite poles is thus induced by the action of the electromagnetic wave on the electric charges in the electromagnetic resonator at the resonance of the electromagnetic resonator.

The advantage of planar antennas, such as the one illustrated by reference to FIG. 3b is that they allow good impedance match with free space, in other words a better collection of the THz electromagnetic wave. Such antennas can also be engineered with a large operation frequency bandwidth.

The advantage of patch antennas, such as the ones illustrated by reference to FIGS. 4a, and 4b is that they allow strong confinement of the electric field in the gap between the first element 2 and the opposite element 4, which may be for example made of metal, which results in a stronger induced mechanical force. Furthermore, the dielectric layer 31 can be replaced with a semiconductor layer, which contains quantum heterostructures that absorb waves in the THz domain.

FIGS. 5a, 5b, 5c, 5d and 5e illustrate electromagnetic characteristics of the embodiment of FIGS. 1a and 1b of a THz optomechanical transducer, respectively, a set-up for the measurement of the electromagnetic characteristics, a measurement obtained with the set-up and a simulation of electric fields generated in an electromagnetic resonator of the THz optomechanical transducer.

Figure 5B:
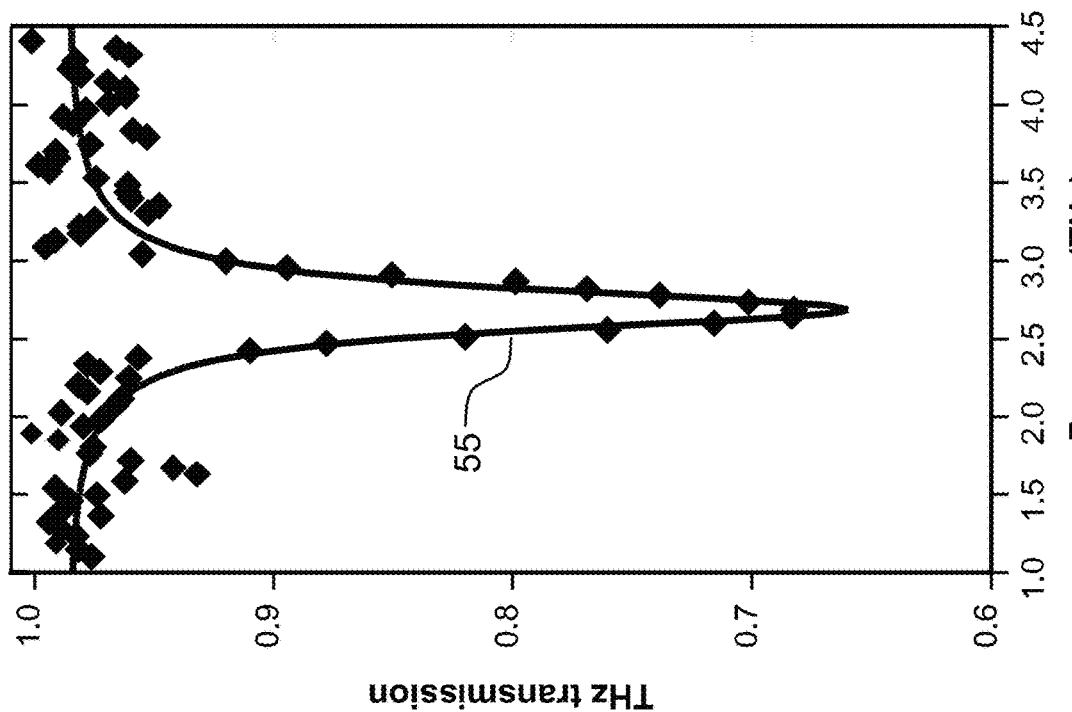
FIGS. 5a, 5b, 5c, 5d and 5e illustrate electromagnetic characteristics of an embodiment of a THz optomechanical transducer.
Figure 5A:
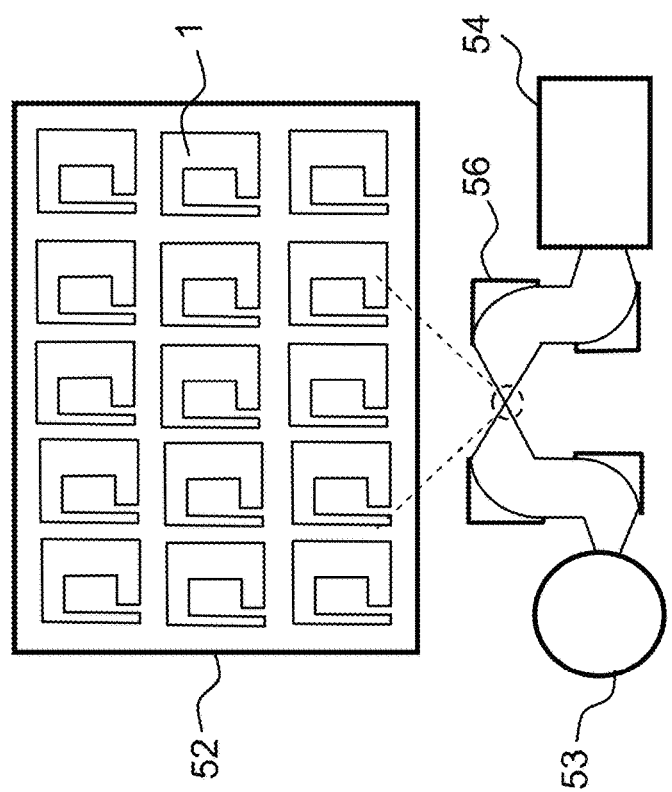

As illustrated by FIG. 5a, to measure the spectral response of the SRR, transmission measurements are performed with a source 53 for an electromagnetic wave in the THz domain, a Fourier Transform Interferometer 54 and a cooled Ge-bolometer 54 on a dense array 52 of electromagnetic resonators 1. The incident electromagnetic wave is focused on the dense array 52 with the help of four parabolic mirrors 56. The measurement is done on a dense array of electromagnetic resonators in order to increase the amplitude of the absorption features. The frequency spectrum 55 represented on FIG. 5b of the electromagnetic wave measured by the Ge-bolometer 54 shows a single absorption dip that is well fitted by a Lorentzian profile, with a central frequency at $f_{THz}=\omega_{THz}/2\pi=2.7$ THz that corresponds to the fundamental electromagnetic resonance mode of the SRR, and a quality factor $Q_{THz}=fTHz/DfTHz=8.4$, the quality factor being the ratio between the electromagnetic resonance frequency and the full width at half maximum of the spectrum of FIG. 5b. These characteristics may be confirmed by numerical modelling based on a finite elements method software.

Figure 5C:
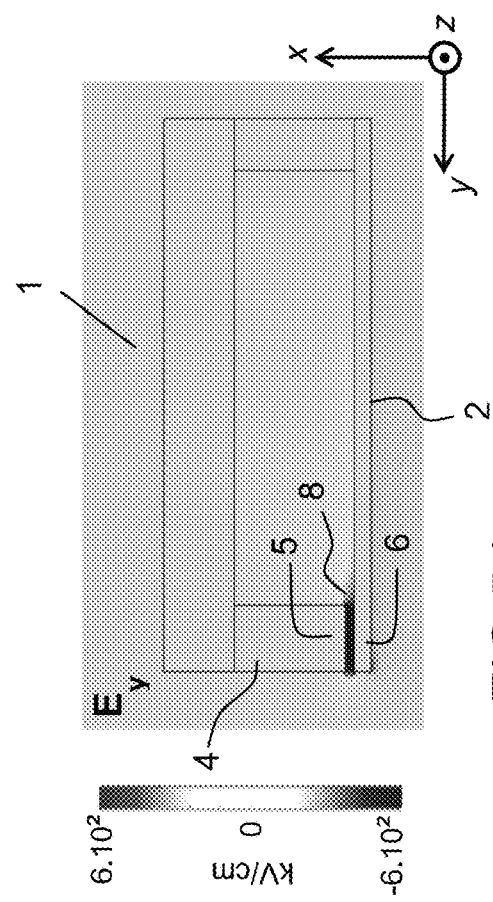

Referring to FIG. 5c the vertical electric field Ez distribution normal to the top metal surface of the split-ring ring provided by the simulations is shown. While the field is strongest around the gap, it spreads along the structure which indicates that the SRR electromagnetic resonance is dominated by propagation effects. Indeed, the SRR resonant wavelength may be calculated by the formula $\lambda_{res}=2*n_{eff}*P$, wherein P=44.5 µm represents the medium perimeter of the SRR and $n_{eff}=1.2$ represents an effective index that takes into account the leak of the field in the air and in the semiconductor. According to Gauss's theorem, the component of the field in the z direction provides a surface charge density on the metal plates induced at the electromagnetic resonance of the electromagnetic resonator. The resulting force is strongest around the capacitive gap of the SRR, where the distance between the electric charges is the smallest. The force resulting from this electric charge distribution excites the cantilever movement in the plane of the SSR.

Figure 5D:
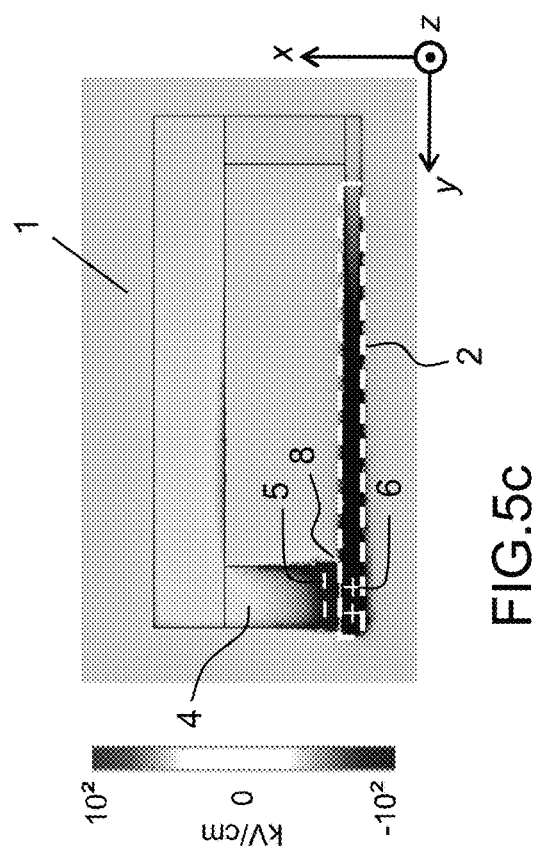
Figure 5E:
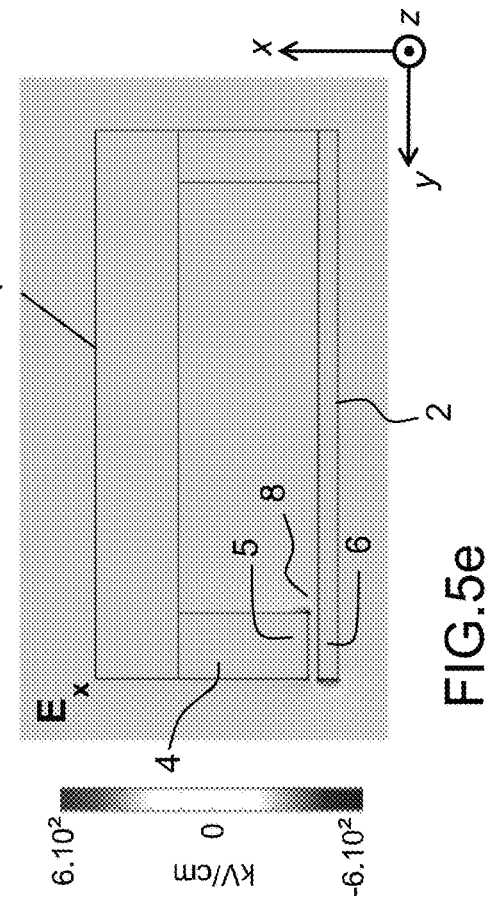

Referring respectively to FIGS. 5d and 5e, the horizontal electric fields Ey and Ex distribution of the split-ring ring provided by the simulations is shown. We observe from these simulations that the absolute maximum of the x- and y-components of the in-plane electric field are similar, which indicates that both polarization can be equally coupled.

Figure 6B:
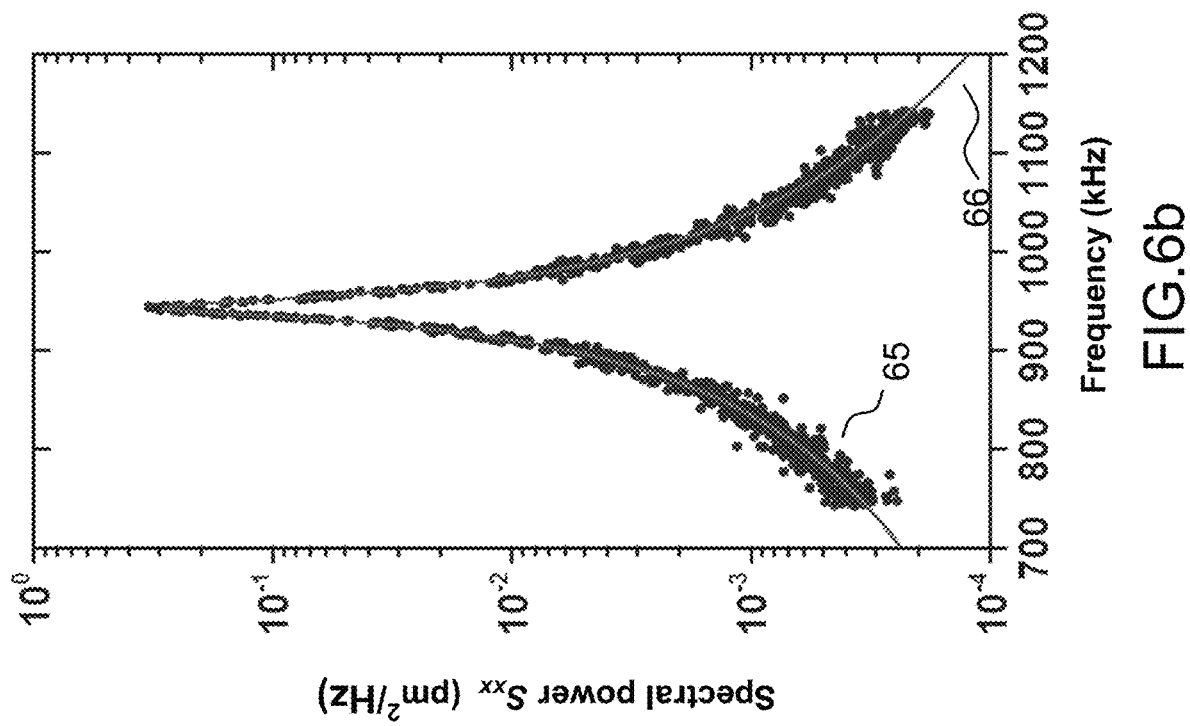
FIGS. 6a, 6b and 6c illustrate mechanical characteristics of an embodiment of a THz optomechanical transducer.
Figure 6A:
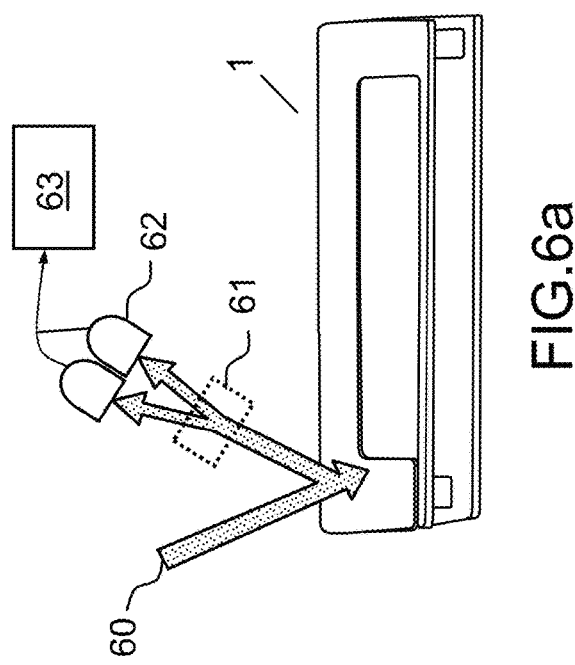
Figure 6C:
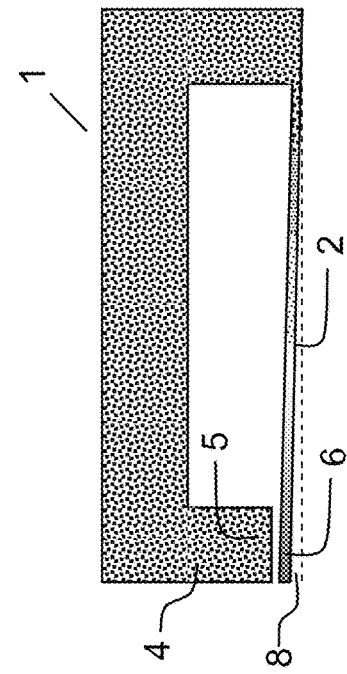

FIGS. 6a, 6b and 6c illustrate mechanical characteristics of the embodiment of FIGS. 1a and 1b of the THz optomechanical transducer, respectively, a set-up for the measurement of the mechanical characteristics, a measurement obtained with the set-up and a simulation of the fundamental mechanical mode of the cantilever 2.

As illustrated by FIGS. 6a and 6c, the movement of the cantilever of FIGS. 1a and 1b may be detected by means of an optical detector and a near infrared laser source 61, with a wavelength for example λ=940 nm. The fraction of the near infrared laser beam 60 reflected by the cantilever 2 is sent to a sharp edge blade 61 and received by a balanced photo-detection unit 62 connected to a spectral analyzer 63. This optical detection scheme allows probing the Brownian motion in the cantilever which corresponds to the fundamental in-plane flexural mode. A typical output from that experiment, obtained on the spectrum analyzer connected to the photodiodes, is shown in the graph of FIG. 6b. The line 66 is a fit of the data spots 65 using the analytical expression for the noise spectral power density $S_{xx}(f)$ of a damped mechanical oscillator. From this fit, a mechanical resonance frequency and quality factor may be computed. For the example of FIG. 6b, a mechanical frequency $\omega_m/2\pi=957$ kHz and quality factor $Q_m=93$ may be computed. Furthermore, the knowledge of the cantilever dimension and composition allows determining precisely the effective mass of the oscillator, $m_{eff}=10.7$ pg. From these values, the peak noise spectral density may be computed as $S_{xx}(f_m)=2k_B*T*Q_m/m_{eff}\,\omega_m^3=0.33$ pm²/Hz, where $k_B$ is the Boltzmann constant and T=300K is the room temperature. This value allows to calibrate the voltage readings of the apparatus (spectrum analyzer) used to measure the displacement of the cantilever, i.e. to convert the voltage readings into nanometers. A numerical simulation of this mode is illustrated by FIG. 6c. In the example illustrated by FIG. 6c, the displacement of the free extremity of the cantilever 2 is between 0.8 and 1 nanometer, while for the middle of the cantilever 2 the displacement is between 0.1 and 0.3 nanometer. The texture used for the element 4 indicates that the displacement is null for this element 4.

Figure 7:
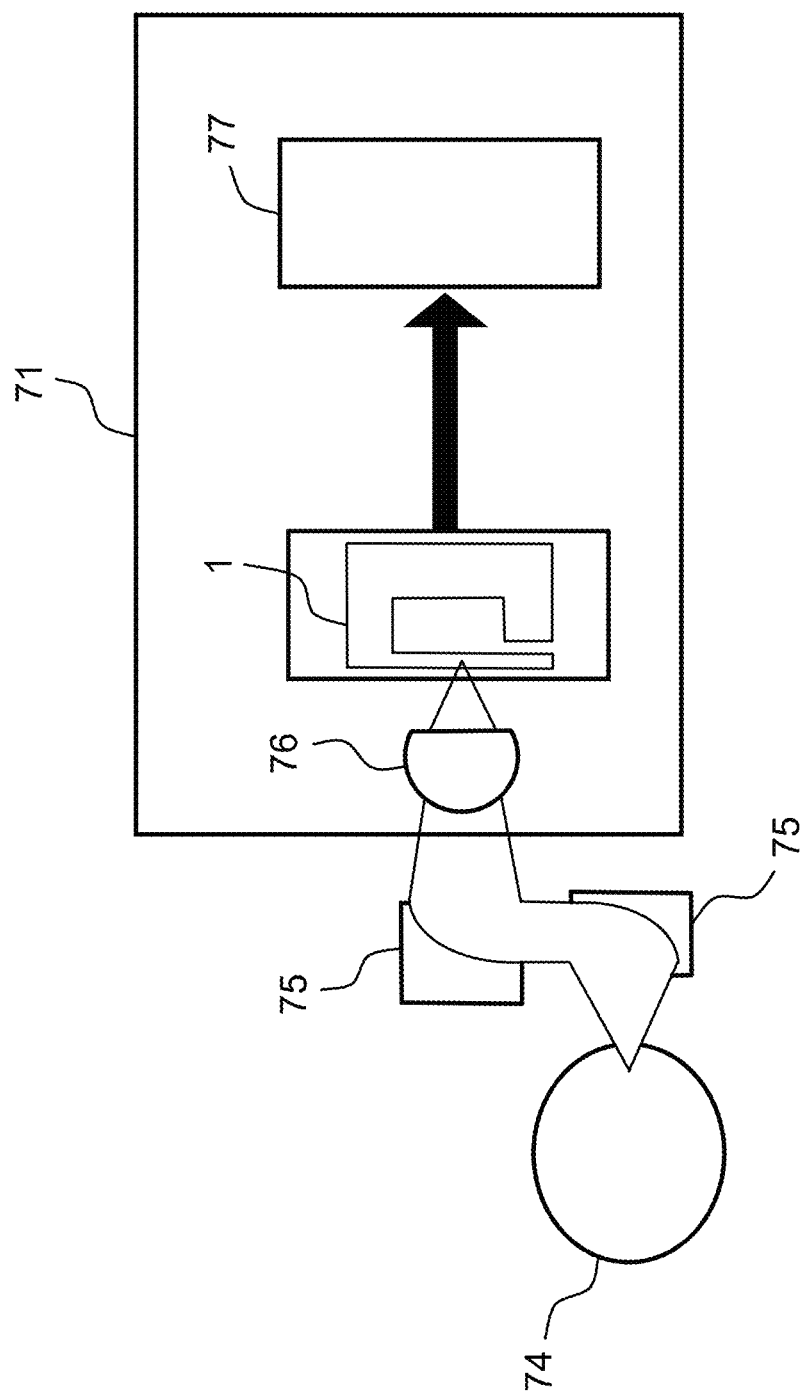
FIG. 7 illustrates an embodiment of a detector of a signal representative of a mechanical response in a THz optomechanical transducer.

FIG. 7 illustrates an embodiment of a detector of a signal generated by a terahertz optomechanical transducer. The detector comprises an electromagnetic wave source 74, for example, a THz source such as a THz Quantum Cascade Laser.

The detector 71 comprises at least one optomechanical THz transducer 1 as described therein. The detector may comprise a lens, such as for example a silicium hyperhemispherical lens, to focus the electromagnetic waves on the terahertz optomechanical transducer and a detection device 77 for detecting a signal representative of the mechanical response of a mechanically responsive element of the electromagnetic resonator.

The detection and measurement of a signal representative of the mechanical response of the mechanically responsive element of the electromagnetic resonator may be performed by optical or electrical means.

When the mechanical response is a frequency shift of the mechanical resonance of the mechanically responsive element, the amplitude of this frequency shift may for example, be measured using a phase-locked loop circuitry.

When the mechanical response is deformation, a movement or a vibration of the mechanically responsive element, the amplitude of this mechanical response may be detected and read-out by using optical detection means, for example a telecom laser or by using the detection scheme described by reference to FIG. 5a or 6a.

The movement of the deformable element under the influence of the THz radiation can be described by the following equation of motion, derived from an effective capacitor-inductance model for the resonator:

$$\frac{d^2x}{dt^2} + \frac{\omega_m}{Q_m}\frac{dx}{dt} + \omega_m^2 x = -\frac{W_{THz}(t)}{m_{eff}}\frac{d\ln C_{eff}}{dx}\bigg|_{x=d_{gap}} \quad (\text{Eq 1})$$

where:
x is the position of the deformable element,
Ln is the Neperian logarithm function,
$C_{eff}(x)$ is the effective capacitance of the charge distribution of the THz mode and
$W_{THz}(t)$ is the time dependent electric energy stored in the resonator at the electromagnetic resonance.

Unlike some radio frequency converters, the electric energy oscillates in the THz range, $W_{THz}(t)\sim\cos^2(\omega_{THz}t)$, at a frequency that is six orders of magnitude higher than the mechanical frequency $\omega_m$. In fact, the cantilever is only sensitive to the average value of the electric energy $<W_{THz}>$, averaged over the THz oscillation cycles.

This average value of $W_{THz}(t)$ can be expressed as $$<W_{THz}>=I_{THz}A_{coll}Q_{THz}/2\omega_{THz}$$

where $I_{THz}$ is the intensity (W/m²) of the incident electromagnetic wave, $A_{coll}$ is a collection area, defined in such a way that the quantity $I_{THz}A_{coll}$ corresponds to the power dropped in the resonator. Then, according to equation (Eq1), the effect of a continuous THz electromagnetic wave is to change, i.e. displace, the rest position of the cantilever.

The effect of the THz radiation can be exalted if the intensity of the incident electromagnetic wave is modulated at the mechanical resonance frequency $\omega_m$ of the mechanical resonator or cantilever, which allows the resonant excitation of its vibrational motion. For a sinusoidal modulation $I_{THz}(t) = I^0{}_{THz}(1+\cos(\omega_m t))$, one can define an internal responsivity of the system as the ratio between the amplitude of the induced mechanical motion $x_{max}$, and the peak THz power $A_{coll}I^0{}_{THz}$ coupled by the THz resonator:

$$R_{in} = \frac{x_{max}}{A_{coll}I^0_{THz}} = \frac{1}{2} \frac{Q_m Q_{THz}}{\omega_m^2 \omega_{THz} m_{eff} d_{gap}^{eff}} \quad (Eq\ 2)$$

As the responsivity is proportional to $Q_m Q_{THz}$, the equation (Eq2) clearly uncovers the double effect of recycling of the vibration quanta and the THz photons.

The effective capacitive gap $d_{gap}{}^{eff}=((d\ln C_{eff}/dx)|_{x=d_{gap}})^{-1}$ depends on the details of the charge distribution at electromagnetic resonance. For the embodiment of FIG. 1a or 1b, one can estimate $d_{gap}{}^{eff} \sim 546$ nm based on the improved Palmer formula of the capacitance, which takes into account the effect of fringing fields. Using equation (Eq2) together with the value of the expression of the peak noise density of the Brownian motion, an analytical expression of the internal Noise Equivalent Power (NEP) for the device, defined as $NEP=S_{xx}(f_m)^{1/2}/R_{in}$ may be written as:

$$NEP = \sqrt{2k_B T m_{eff} \Gamma_m} \frac{2\omega_{THz} d_{gap}^{eff}}{Q_{THz}} \quad (Eq\ 3)$$

The linewidth of the mechanical mode of the deformable element is $\Gamma_m = \omega_m/Q_m$. The equations (Eq2) and (Eq3) can be applied to other geometries of the electromagnetic resonator and provide useful tools for the design of THz optomechanical transducer. For the embodiment of FIG. 1a, the internal responsivity as defined in Eq.2 is $R_{in} \sim 113$ fm/nW and the Noise Equivalent Power NEP is 4.8 nW/Hz$^{1/2}$.

FIGS. 8a, 8b, 8c, 8d and 8e illustrate an embodiment of a detector of a signal representative of a mechanical response of a THz optomechanical transducer, a spectrum obtained by this detector, and the variation of the amplitude of the signal according to the time.

Figure 8A:
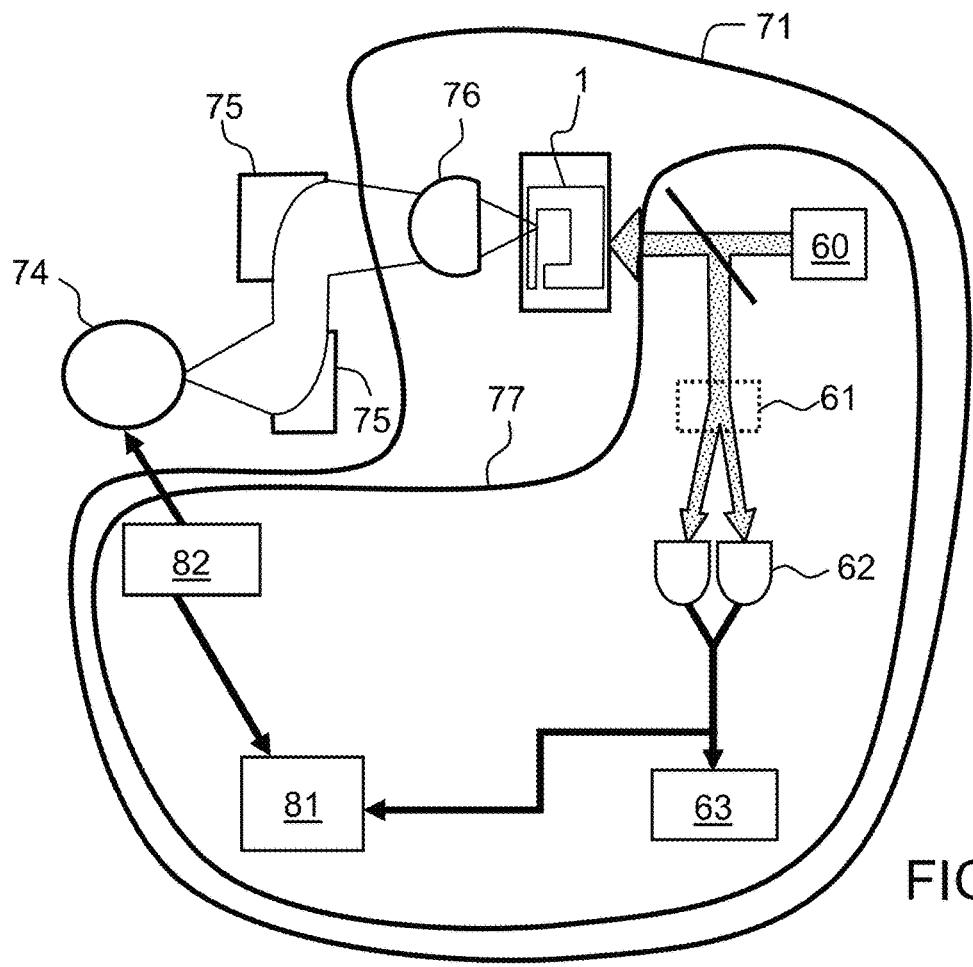
FIGS. 8a, 8b, 8c, 8d, and 8(e) illustrate an embodiment of a detector of a signal representative of a mechanical response in a THz optomechanical transducer.

Referring to FIG. 8a, the THz source 74 may be for example a quantum cascade laser (QCL) with an emission frequency 2.5 THz and a maximum output power of 4.7 mW. The THz electromagnetic wave from the QCL is collected with two parabolic mirrors 75 and focused on a single SRR 1 with the help of a silicon hyper-hemispherical lens 76, positioned on the backside of the GaAs substrate. To produce the required modulation of the THz power at the cantilever vibrational frequency the QCL drive current was modulated with a signal generator 82. The cantilever oscillation was detected and read-out with the NIR laser 60 and the balanced detection 61, 62 as previously described. The differential signal from the photodiodes was sent either to a spectrum analyzer 63, or to a lock-in amplifier 81 referenced to the QCL modulation frequency 82.

Figure 8B:
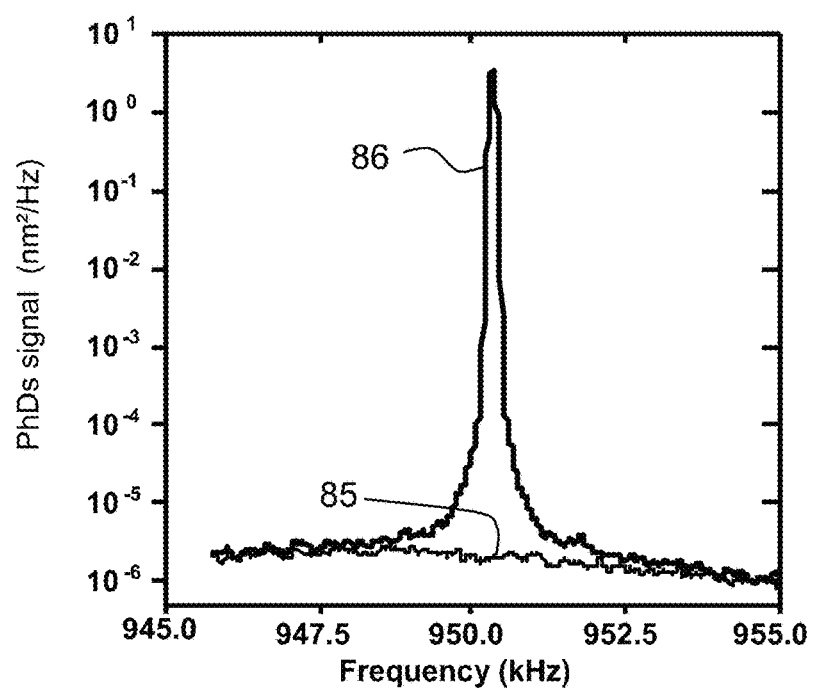

FIG. 8b shows the output of the spectrum analyzer 63 in the case with, respectively without, the THz source 74. The peak in the spectrum 86 represents the output signal with the THz source 74 and the spectrum 85 represent the noise of the detection without the THz source 74. The spectrum 74 shows the Brownian motion of the lever with a Dirac-like resonant response atop. This peak shows that the mechanical device responds to the incident THz electromagnetic wave, and that this mechanical response can be made resonant provided the THz electromagnetic wave is modulated at the proper frequency.

Figure 8C:
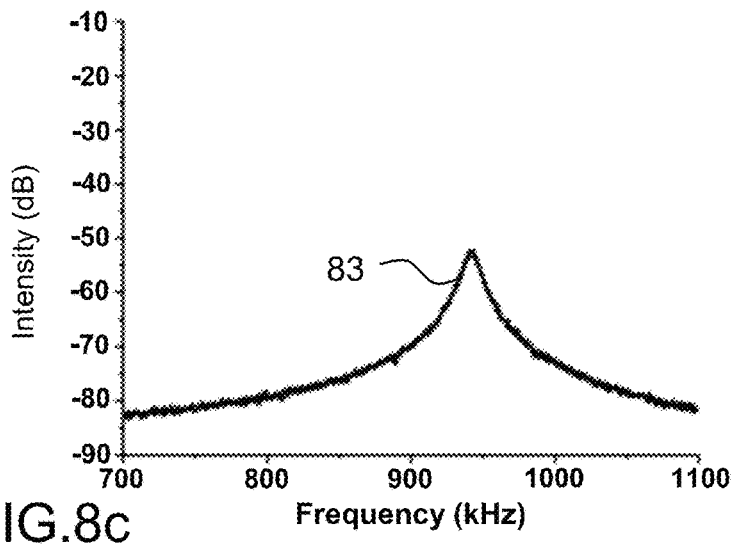
Figure 8D:
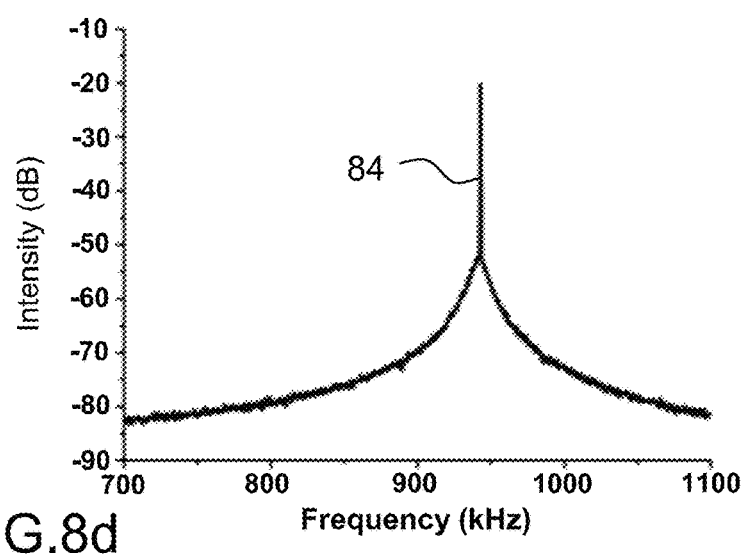

FIG. 8c shows a spectrum when the THz source is off, with a mechanical resonance at 945 kHZ that corresponds to the in-plane flexural mode of the lever. The detected motion is Brownian in nature, triggered by thermal fluctuations of the room temperature environment of the device. In FIG. 8d, the source is on and is modulated at 945 kHz, which corresponds precisely to the mechanical resonance frequency. The spectrum now shows the Brownian motion of the lever with a Dirac-like resonant response atop. This peak shows that the mechanical device responds to the incident THz electromagnetic wave, and that this mechanical response can be made resonant provided the THz electromagnetic wave is modulated at the proper frequency. The peak value of 86 is the detected signal, while the base value in 85 at the same frequency represents the noise of the detector described in FIG. 8a.

Figure 8E:
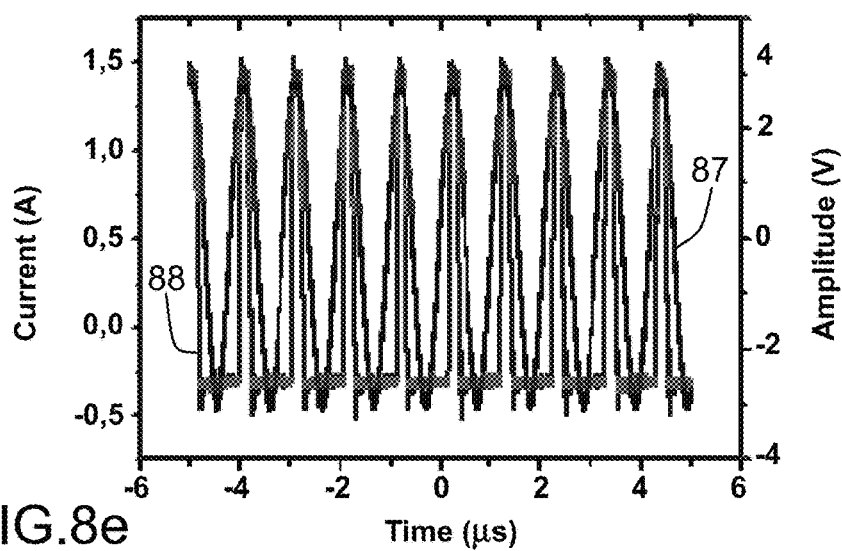

FIG. 8e shows the input drive current of the THz source 88 and the output signal of the photodetectors 87 as a function of time. These signals are obtained with the help of an oscilloscope (not shown). Since the intensity of the THz source is a linear function of the drive current, the signal 88 represents the time variations of the intensity of the THz source. The signal 87 represents the mechanical response of the deformable element under the action of the THz radiation.

The incident THz radiation has a frequency $\omega THz$ while its intensity is modulated at a frequency $\omega m \ll \omega THz$. The overall incoming signal is then of the form $ITHz(t)=I0$ THz $(1+\cos(\omega mt))\cos^2(\omega THzt)$. In order to have a significant mechanical response to the incoming THz radiation in the examples described by FIG. 8a, b, c, d, e, the frequency $\omega THz$ is close—e.g. in the response bandwidth defined by the quality factor—to the electromagnetic resonance frequency of the THz split-ring resonator (condition (i)); and the frequency $\omega m$ is close—e.g. in the response bandwidth defined by the quality factor—to the mechanical resonance frequency of the mechanical resonator (condition (ii)).

If neither of the conditions (i) and (ii) is fulfilled, one observes only the thermal fluctuations of the cantilever motion, as shown in FIG. 8c.

If only i) is fulfilled, then one can observe a mechanical response for mechanical frequencies of the modulation much lower, that the mechanical resonant frequency, however this response is usually Qm times lower than the signal at resonance.

If only ii) is fulfilled, but not i), then the incoming THz radiation (whose terahertz frequency is far to the resonant frequency of the THz split-ring resonator) is not coupled into the THz resonator and no response is observed.

In one or more embodiments, the first element of the split ring does not react with a measurable mechanical response to an incident wave having solely a frequency equal to the mechanical frequency of resonance of the first element.

Figure 10A:
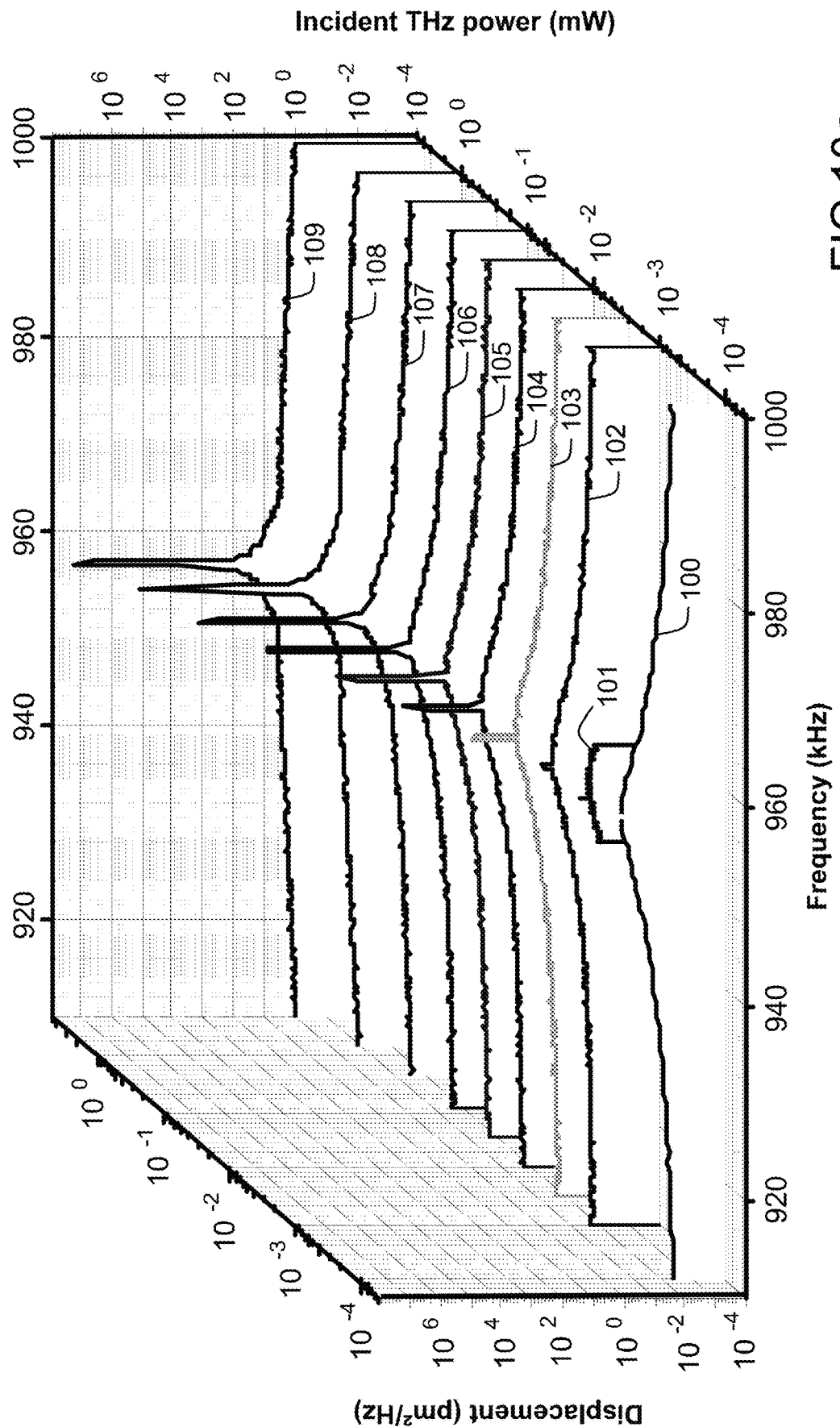
FIGS. 10a, 10b and 10c illustrate characteristics of an embodiment of a THz optomechanical transducer.
Figure 10B:
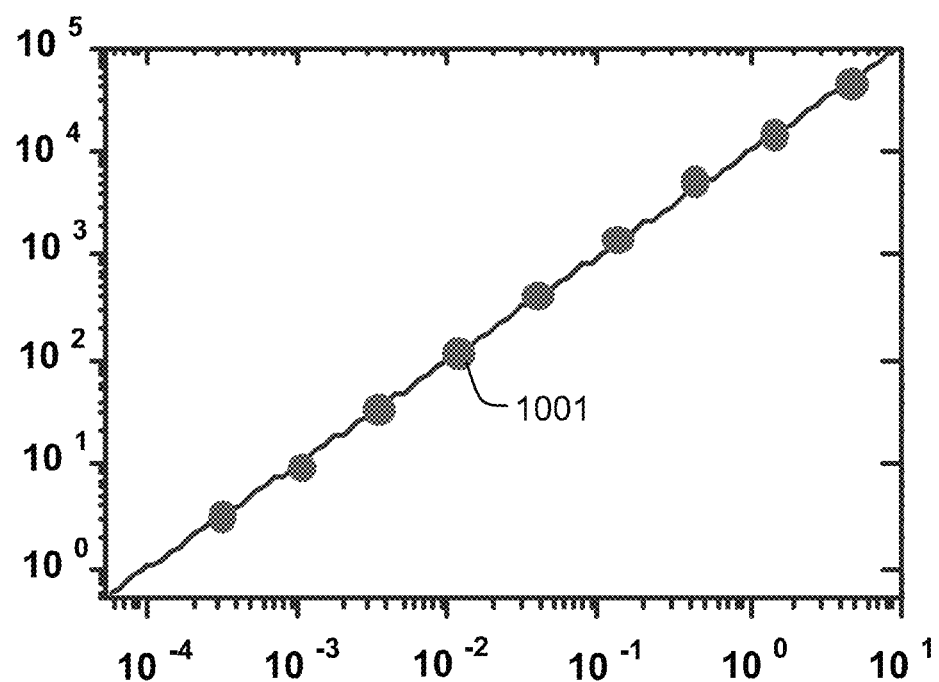
Figure 10C:
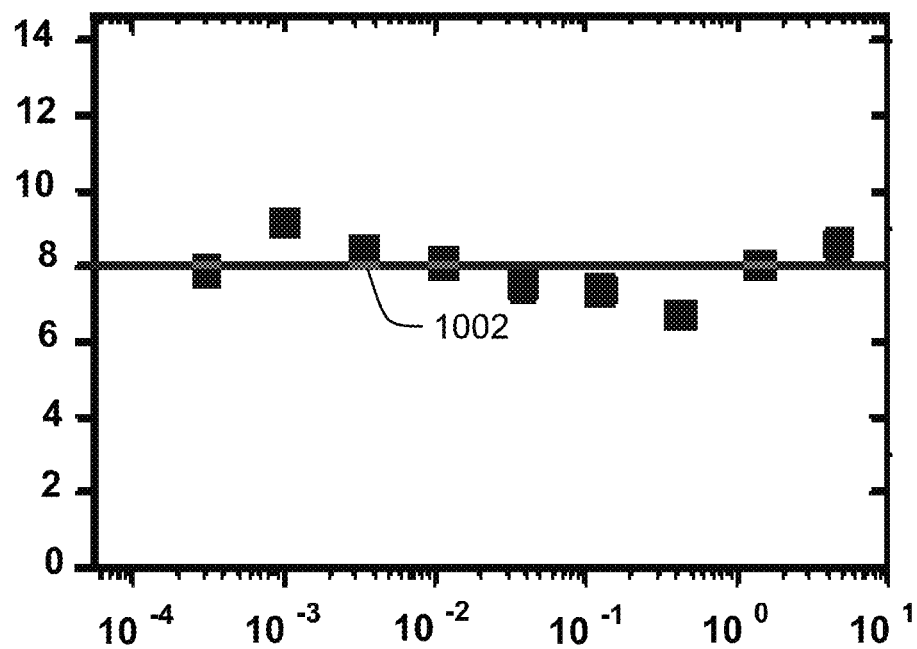

FIGS. 10a, 10b and 10c illustrate characteristics of a signal representative of a mechanical response in a THz optomechanical transducer according to the embodiment of FIG. 1a or 1b, and the experimental set-up shown in FIG. 8a.

FIG. 10a shows different spectra of the mechanical response of the cantilever of the embodiment of FIG. 1, measured with a spectrum analyzer, and as a function of the power of the incident electromagnetic wave. For these spectra, the laser source was driven at its maximum power of 4.7 mW and modulated with a square wave with a duty cycle of 16.5%, at a frequency $f_{mod}$=955 kHz, close to the mechanical resonance of the cantilever. The power of the incident electromagnetic wave on the structure was attenuated with a series of identical paper absorbers, each providing 30% transmission. The curve 100 indicates the reference signal of the spectrum analyzer when the laser is not running and corresponds to the cantilever's Brownian motion. The displacement induced by the THz source appears as a single Dirac-like peak on top of the Brownian noise. The phase noise appearing in the spectra at higher THz powers (42 µW, 1.4 mW and 4.7 mW, respectively 107, 108 and 109 in FIG. 10b) reflects the phase noise of the signal generator used to modulate the QCL. From this data, and using the calibration of the noise spectral density $S_{xx}(f)$ the amplitude of the cantilever motion and the NEP of the structure can be determined respectively, as shown in FIGS. 10b and 10c. It appears that the amplitude follows closely the expected linear dependence between the amplitude of the mechanical response and the amplitude of the incident electromagnetic wave and that the linear dynamics of the detector scheme is preserved over five orders of magnitude of the power of the incident electromagnetic wave. The responsivity and NEP obtained are respectively R=50 fm/nW, and NEP=8 nW/$Hz^{1/2}$.

Figure 11A:
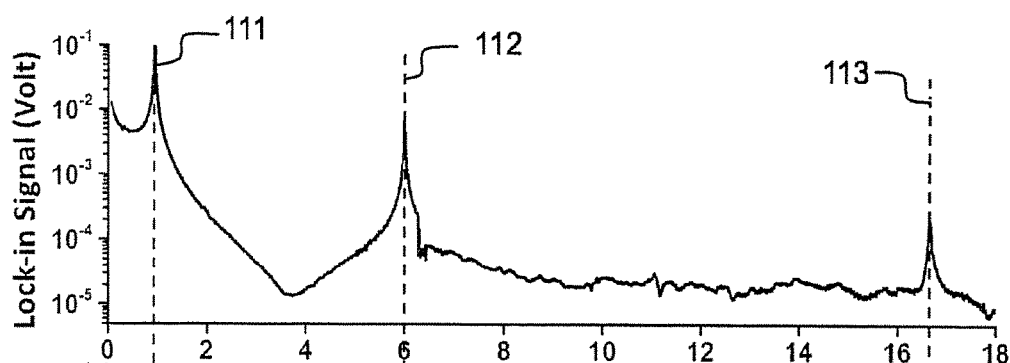
FIGS. 11a, 11b and 11c illustrate characteristics of an embodiment of a THz optomechanical transducer.
Figure 11B:
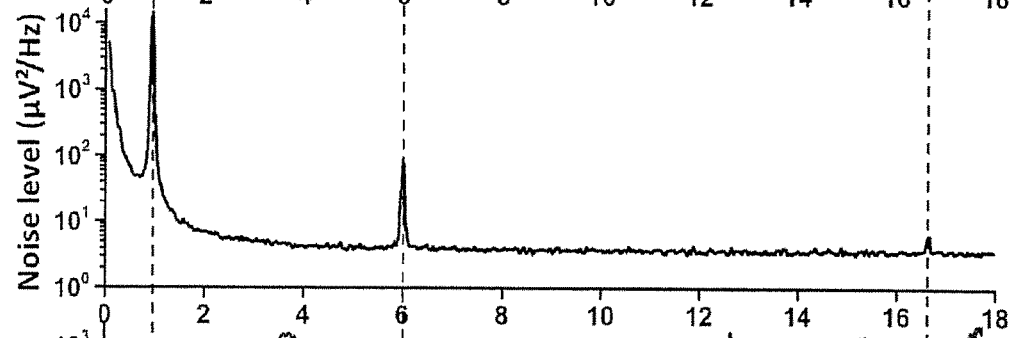
Figure 11C:
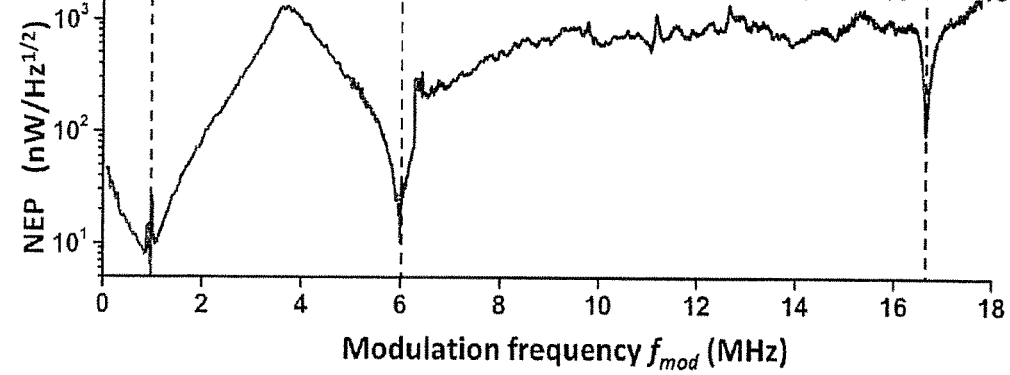

FIGS. 11a, 11b and 11c represent respectively a Lock-in signal (11a), a noise level (11b) and NEP (11c) as a function of the modulation frequency in a THz optomechanical transducer according to the embodiment of FIG. 1a or 1b.

To explore further the performance of the detector, its behavior as a function of the QCL current modulation frequency has been studied in order to determine the operation bandwidth of the detector. For these measurements, in order to access both amplitude and phase of the induced cantilever motion, the spectrum analyzer was replaced by the lock-in amplifier.

FIG. 11a shows the amplitude of the lock-in signal when $f_{mod}$ is spanned from 70 kHz to 18 MHz. This graph maps the mechanical transfer function for the driven deformable element movement excited by the THz radiation. Three modes are clearly visible; the first mode with a frequency $f_{m1}$=955 kHz (111) presented above and two higher order modes at a frequency $f_{m2}$=6 MHz (112) and a frequency $f_{m3}$=16.7 MHz (113). These values are in excellent agreement with the theoretical expression $f_{mn}=2.81f_{m1}(n-0.5)^2$ where n is order (1, 2, 3, . . . ).

FIG. 11b provides the noise spectrum of the detector in the same frequency range, for the case where the QCL in not running FIG. 11c provides an estimation of the detector's NEP as derived from the noise and signal spectra (namely by dividing the signal spectrum on the square root of the noise spectrum) and the knowledge of the QCL power. This graph shows, on one hand, that one can exploit high order mechanical resonances to operate the detector at higher modulation frequencies. On the other hand, the detector can be operated in wide bands around the mechanical resonances that are several times wider than their intrinsic linewidths.

Figure 12A:
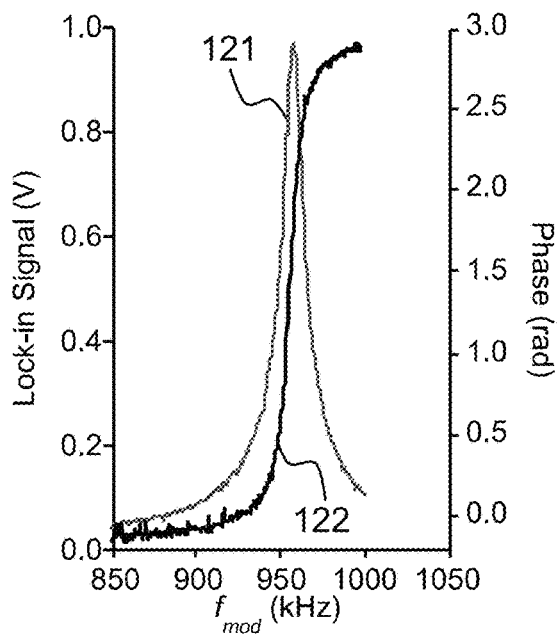
FIGS. 12a, 12b and 12c illustrate characteristics of an embodiment of a THz optomechanical transducer.
Figure 12B:
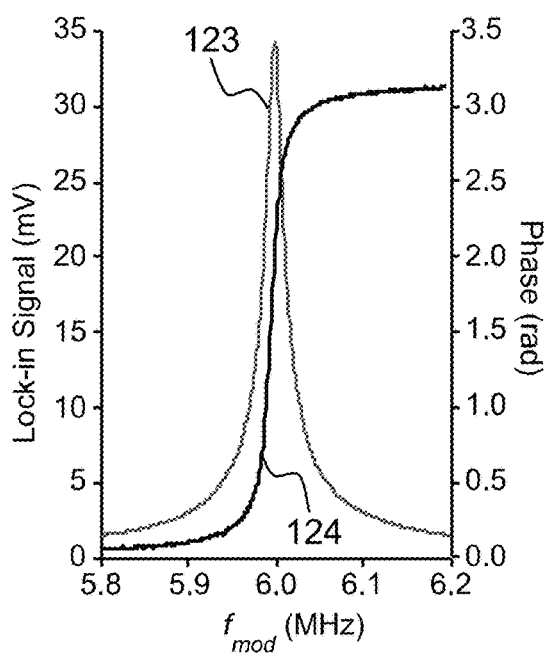
Figure 12C:
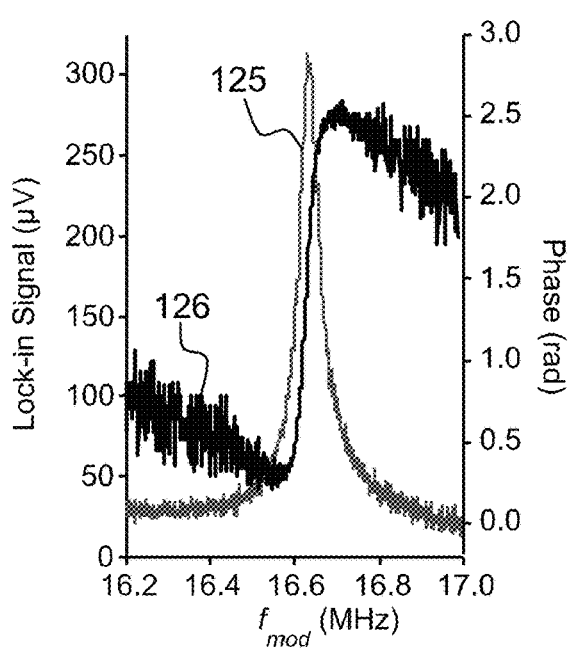

FIGS. 12a, 12c and 12c represent high resolution scans of the lock-in signal (R) and phase (Φ), when the modulation frequency is varied near the cantilever mechanical resonance frequencies in a THz optomechanical transducer according to the embodiment of FIG. 1a or 1b.

FIGS. 12a, 12c and 12c show both the lock-in signal and phase in high resolution scans of $f_{mod}$ near the mechanical resonances. For the first 121, 122 and second 123, 124 order modes the phase remains very well determined for at least $5\Gamma_m$, while the detector can be clearly operated around $\Gamma_m$ even around 16.6 MHz. These modulation frequencies are thus considerably higher than commercially available Golay cells or bolometers.

Figure 9:
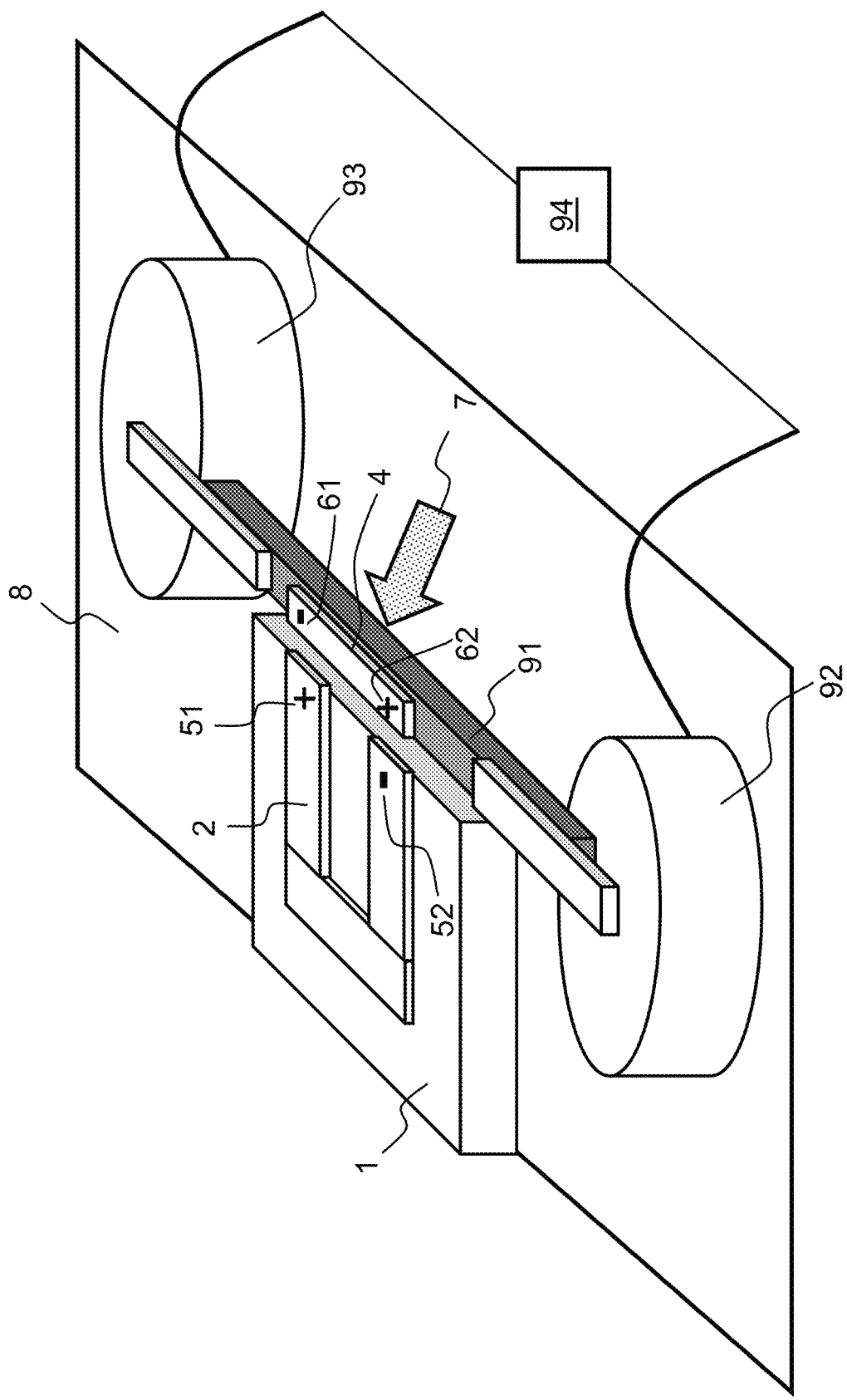
FIG. 9 illustrates an embodiment of a detector of a signal representative of a mechanical response in a THz optomechanical transducer.

FIG. 9 shows an embodiment of a piezoelectric detector of a signal representative of a mechanical response of a THz optomechanical transducer. This piezoelectric detector is implemented according to a piezoelectric detection scheme using a piezoelectric read-out. The electromagnetic resonator is composed of the metal parts 2 and 4. The part 2 is deposited on a dielectric piece 1, which is resting on a dielectric substrate 8. The part 4 is resting on a piezoelectric bar (or piezoelectric beam) 91, which is suspended over the dielectric substrate 8, and is hold by the leads 93 and 92. The leads 93 and 92 are electrical electrodes that provide an electric connection to the piezoelectric bar 91. Under the influence of an incident THz radiation, an electromagnetic resonance is excited in the resonator composed of 2 and 4. This results of the excitation of charges with opposite signs in the electric poles 51, 61 and 52, 62. The resulting Coulomb force induces a strain 7 on the piezoelectric bar 91. The strain induces a voltage in the leads 92 and 93 due to the piezoelectric effect. The leads 92 and 93 are conveniently connected to an external electrical circuit 94 and allow to read the piezoelectric voltage. Since the piezoelectric voltage is proportional to the intensity of the incident THz beam, this scheme allows an all electrical read out of the THz signal.

Figure 13:
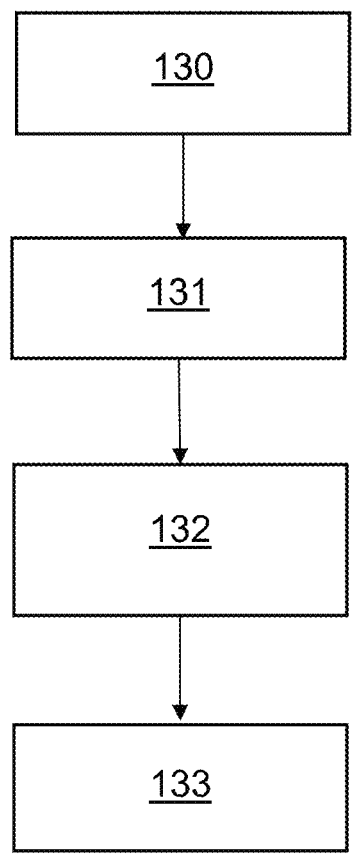
FIG. 13 shows a flowchart of an embodiment of a method for transducing and detecting a THz electromagnetic wave.

FIG. 13 shows the steps of an embodiment of a method for collecting and transducing an electromagnetic wave having a frequency within a terahertz frequency band of use by means of a terahertz optomechanical transducer according to any embodiment disclosed therein.

The terahertz optomechanical transducer comprises an electromagnetic resonator having a response bandwidth including a main frequency of electromagnetic wave. The electromagnetic resonator comprises a first element and an opposite element forming with the first element a capacitive gap of the electromagnetic resonator. In one or more embodiments, the electromagnetic resonator comprises a mechanical resonator. The mechanical resonator may comprise the first element and/or the opposite element.

The method comprises a step of generating 130 an incident electromagnetic wave. The frequency of the incident electromagnetic wave may be adjusted to the electromagnetic terahertz resonance frequency of the electromagnetic resonator, or more generally be in the response bandwidth of the electromagnetic resonator which corresponds to the electromagnetic terahertz resonance frequency up to the quality factor). In one or more embodiments, the intensity of the incident electromagnetic wave may be modulated at a frequency within a response mechanical frequency bandwidth of a mechanical resonator of the terahertz optomechanical transducer, to the resonance frequency of the mechanical resonator.

The method further comprises a step of collecting 131 the electromagnetic wave by the terahertz optomechanical transducer.

The method further comprises a step of producing 132 a mechanical response of at least one mechanically responsive element of the electromagnetic resonator by action of the force stemming from the electric field generated by interaction of the electromagnetic wave on electric charges present in the electromagnetic resonator. The first element and/or the opposite element may be mechanically responsive to the action of the force stemming from the electric field. The electric field may be generated between a first electric pole induced in the first element by first electric charges having a first electrical sign and a second electric pole induced in the opposite element by second electric charges having a second electrical sign opposite to the first electrical sign.

The method further comprises a step of detecting 133 an output signal representative of the mechanical response. The detection may be performed by any detection method described therein, for example based on optical means or electric means.

Figure 14A:
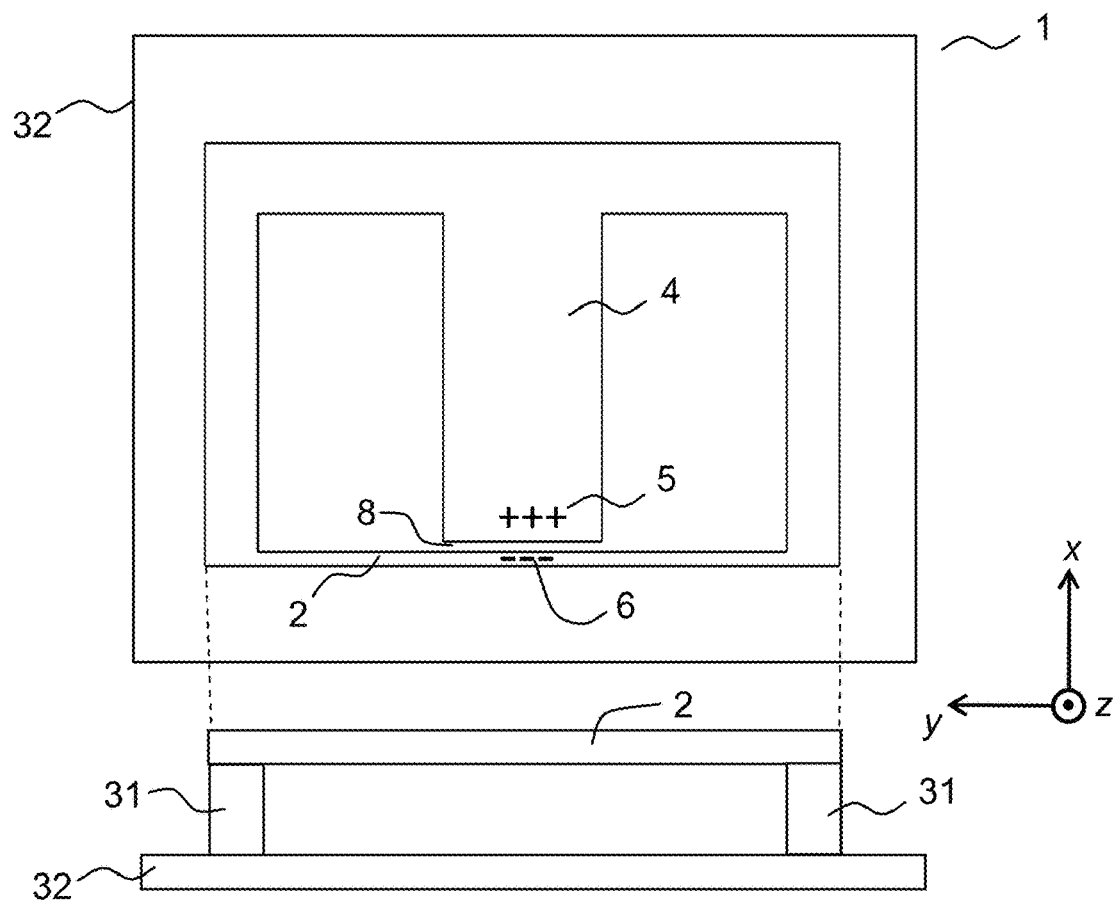
FIGS. 14a and 14b represent schematically an embodiment of a THz optomechanical transducer according to the present description with the electromagnetic characteristics of this embodiment.
Figure 14B:
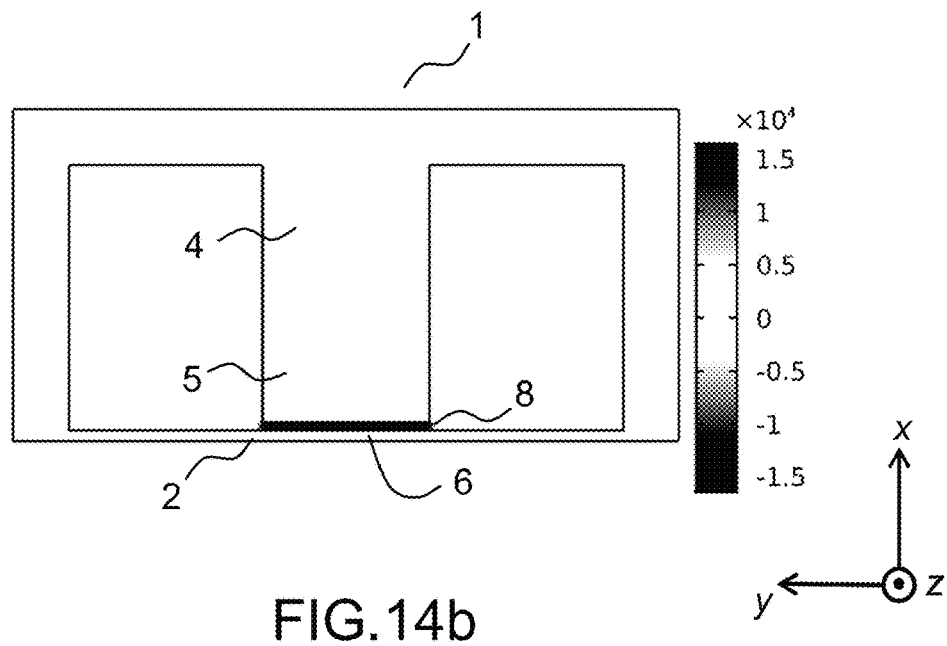

FIG. 14a and FIG. 14b illustrate a example of a THz optomechanical transducer 1 according to the present description with the electromagnetic characteristics of this example. In this example, the electromagnetic resonator comprises in one part the first element 2 and the opposite element 4 which may for example comprise a metal layer. The first element 2 and the opposite element 4 are separated by a gap 8. The first element 2 has the particularity to be suspended in the air over a substrate 32 between two dielectric layers 31 and in front of the opposite element 4. The suspension of the first element 2 between two dielectric layers 31 has the advantage to avoid the first element to stick to the substrate 32; moreover it allows a lighter first element to be made of just for example a layer of metal such as Au (as illustrated on the side view of this embodiment at the bottom of FIG. 14a). According one embodiment of this example, the entire electromagnetic resonator may rest on the dielectric layer 31 except the first element 2. FIG. 14b represents a simulation of electric fields generated in an electromagnetic resonator of the THz optomechanical transducer, in particular the horizontal electric field Ey distribution of the electromagnetic resonator. We observe from this simulation that the absolute maximum of the y components of the in-plane electric field is located in the gap 8. Thus under the influence of an incident THz radiation, an electromagnetic resonance is excited in the electromagnetic resonator composed of 2 and 4, this results of the excitation of charges with opposite signs in the electric poles 5, 6 and the resulting Coulomb force induces a displacement of the first element 2.

Figure 15A:
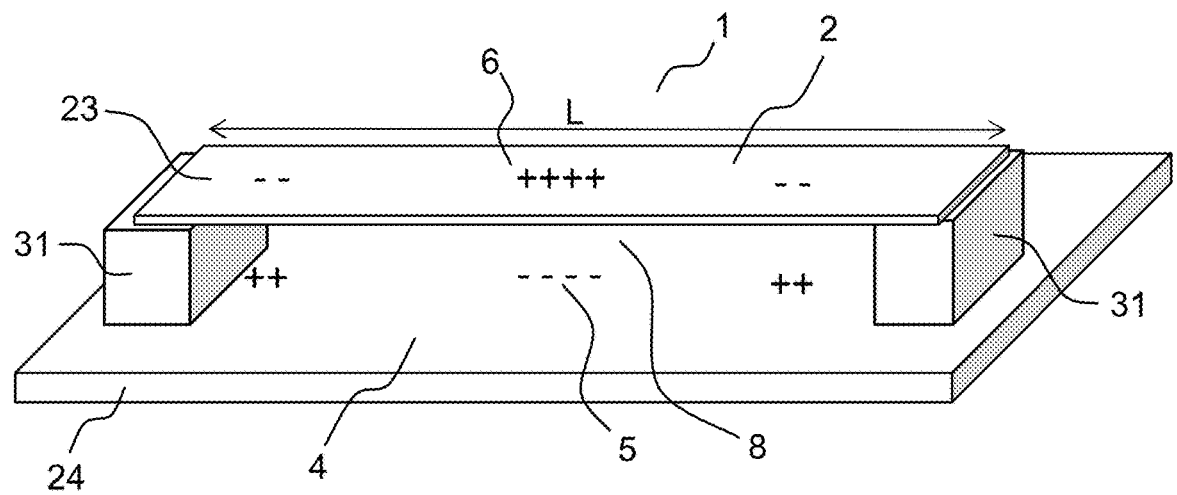
FIGS. 15a and 15b represent schematically other embodiments of a THz optomechanical transducer according to the present description.
Figure 15B:
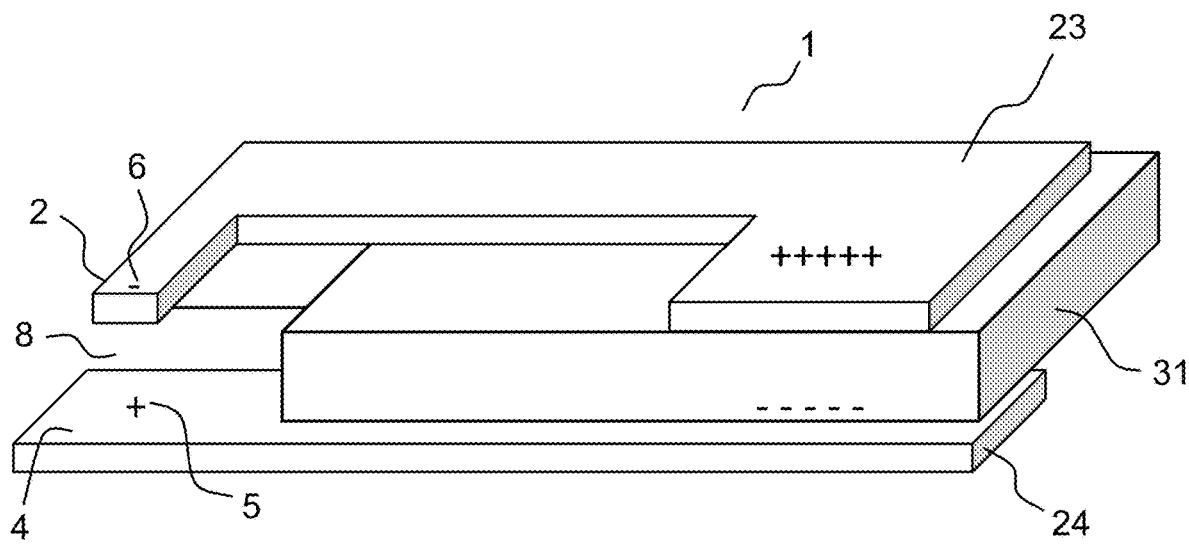

FIG. 15b illustrates an embodiment of a THz optomechanical transducer in a form of a patch antenna in two parts 23, 24, each part being an electrically-connected part of the electromagnetic resonator and are a metal layer. The first electrically-connected part 23 comprises the first element 2 which is the metal layer of the part 23 (mechanically responsive and the other electrically-connected part 24 comprises the opposite element 4. The first electrically-connected part 23 is suspended between two dielectric layers 31 above the second electrically-connected part 24. Thus the two-path connected parts 23, 24 are in two different planes separated by dielectric layers 31 and by for example air to electrically isolate the two electrically-connected parts. As the embodiment of FIG. 14a, this embodiment has the advantage to avoid the first element to stick to the substrate; moreover it allows a lighter first element to be realized with just for example a layer of metal such as Au. Further, the length L of the first electrically-connected part 23 allows controlling the number of dipoles in the electromagnetic resonator. The length L fixes the resonant wavelength $\lambda_{res}$ of the electromagnetic mode, according to the formula $\lambda_{res}=KL/2$, with $K=1, 2, \ldots$. For example, as illustrated in FIG. 15a, when the length L is equal to the wavelength corresponding to the frequency of the incident THz radiation, the resonance of the electromagnetic resonator is a second order resonance (K=2) with three dipoles and two nodes. For the embodiment of FIG. 15a, the applicant shows that the resulting Coulomb force is higher with the second order than with the first order (K=1). Indeed, in the case of the K=1 mode the Coulomb force develops at the edges of the suspended part, while in the case of the K=2 mode it develops at the center of the suspended part where the mechanical displacement is maximum.

FIG. 15b illustrates an embodiment of a THz optomechanical transducer in form of a "horseshoe" resonator. The two-path connected parts 23, 24 are in two different planes separated by a dielectric layer 31 to electrically isolate the two electrically-connected parts. The first electrically-connected part 23 is a "horseshoe" that acts as an inductive element. The first electrically-connected part 23 comprises the first element 2 which is mechanically responsive. The other electrically-connected part 24 is rectangular and comprises the opposite element 4, and also acts as an inductor. The regions where 23 and 24 overlap act as capacitors. The whole structure acts as THz capacitance-inductor resonator. When the electromagnetic resonance of the structure is excited by an incident electromagnetic wave, there is a pair of electrical poles that appear in each capacitive part. In particular, there is a electric field generated between a first electric pole 6 of the first pair of electric poles generated in the first element 2 and a second electric pole 5 of the second pair of electric poles generated in the opposite element 4, the two electric poles forming the electric field having opposite signs. This resonator architecture allows the capacitive part between 2 and 4 to be made very small, and hence the mechanical element 2 to be made with nonmetric dimensions. As the element 2 is made very small, its mechanical response frequency is very high and can be tuned in the GHz region. At the same time, the smaller capacitor volume means higher intensity of the local electric field, and hence a stronger quasi-static Coulomb force.

Optical detection means may include optical interferometry techniques, near-field optical read-out, balanced optical detection technique, optical quadrant detectors, and optical cavity enhanced techniques.

Electrical detection means may include capacitive read-out, piezo-resistive read-out, electron tunneling detection, piezo-electric techniques, magneto-resistive and magneto-electric techniques, electrostatic and dielectric read-out. The read-out mechanical response may be in direct relation to the impinging THZ radiation, which allows to either detect this radiation or to transfer the information carried by the THZ waves onto another information carrier signal, whether optical or electric.

An optomechanical THz detector and a THz optomechanical transducer that operate at room temperature and feature modulation frequencies that are much higher than current pyroelectric or bolometric detectors have been disclosed. This scheme is suitable for industrial applications that rely on powerful THz sources such as QCLs or synchrotron sources, such as tomography, free space communications through mists. Reducing the cantilever dimensions or using other types of resonators can increase even further the modulation frequencies. The planar geometry of the terahertz optomechanical transducer is also very convenient for large scale integration for imaging arrays, or for packaging the transducer on a single chip. Furthermore, the transducer is based on semiconductor technology and operates in frequency ranges where THz electronic transitions in quantum heterostructures can be achieved.

The optomechanical THz detector does not rely on a thermally sensitive material linking a substrate to an electromagnetic resonator. In other terms, the terahertz optomechanical transducer does not rely on an absorption of the terahertz wave which would deform thermally the element and displace the electromagnetic resonator. The first element need not to be linked to a substrate of the electromagnetic resonator by a thermally sensitive material.

In general, in one aspect, the present description relates to a terahertz optomechanical transducer/device for transducing an incident electromagnetic wave having a terahertz frequency within a terahertz frequency band of use. The terahertz optomechanical transducer comprises an electromagnetic resonator having a response bandwidth including the frequency; the electromagnetic resonator comprising a first element and an opposite element forming with the first element a capacitive gap. The first element is configured to response mechanically to the action of a force stemming from an electric field generated by interaction of said incident electromagnetic wave with electric charges in said electromagnetic resonator. The electric field is generated between a first electric pole induced in said first element by first electric charges having a first electrical sign, and a second electric pole induced in said opposite element by second electric charges having a second electrical sign opposite to the first electrical sign. The first electric charges and the second electric charges alternate between the first and the second electric poles in time at the terahertz frequency of the incident electromagnetic wave.

In one or more embodiment, the first element is a mechanical resonator. The mechanical resonance frequency of this mechanical resonator is much lower, for example in the kHz domain or MHz domain, e.g. between 1 kHz and 10 GHz than the electromagnetic resonance frequency of the electromagnetic resonator and may thus be easily detected, for example using an optical or electrical detection scheme.

To generalize, it can be said that the terahertz frequency of the incident electromagnetic wave is at least six to three orders of magnitude higher than said mechanical resonance frequency In one or more embodiments, multiple pairs of electric poles of opposite signs are generated by the interaction of the incident electromagnetic wave with electric charges in said electromagnetic resonator.

In one or more embodiments, the first or second electric charges are excited by said incident electromagnetic wave in a part of the electromagnetic resonator made of a dielectric material or a piezoelectric material.

In one or more embodiments, the first or second electric charges are excited by said incident electromagnetic wave in a part of the electromagnetic resonator made of a metal or a doped semiconductor material.

In one or more embodiments, the electromagnetic resonator comprises at least one split ring and the first element is a cantilever.

In general, in one aspect, the present description relates to a detector for detecting electromagnetic waves, said detector comprising at least one optomechanical terahertz transducer according to the present disclosure and a detection device for detecting an output signal representative of a mechanical response of a first element of at least one of said optomechanical terahertz transducer.

In general, in one aspect, the present description relates to method for transducing an incident electromagnetic wave having a terahertz frequency within a terahertz frequency band of use. The method comprises: collecting the incident electromagnetic wave by an electromagnetic resonator having a response bandwidth including said frequency, said electromagnetic resonator comprising a first element and an opposite element forming with the first element a capacitive gap; and producing a mechanical response of the first element by action of an force stemming from an electric field generated by interaction of said electromagnetic wave on electric charges present in said electromagnetic resonator, wherein said electric field is generated between a first electric pole induced in said first element by first electric charges having a first electrical sign and a second electric pole induced in the opposite element by second electric charges having a second electrical sign opposite to the first electrical sign, wherein the first electric charges and the second electric charges alternate between the first and the second electric poles in time at the terahertz frequency of the incident electromagnetic wave.

In one or more embodiments, the mechanical response of the first 30 element is a frequency shift of the mechanical resonance of the first element.

In one or more embodiments, the mechanical response of the first element is a mechanical deformation or a motion of the first element or a piezoelectric strain.

In general, in one aspect, the present description relates to a method for detecting electromagnetic waves. The method comprises: transducing an incident electromagnetic wave having a terahertz frequency within a terahertz frequency band of use by a method according to any method for transducing an electromagnetic wave disclosed herein; detecting an output signal representative of said mechanical response, the amplitude of the output signal being proportional to the intensity of said incident electromagnetic wave.

In one or more embodiments, the intensity of the incident electromagnetic wave is modulated at a frequency within a response bandwidth of a mechanical resonator comprising the first element.

Although described by way of a number of detailed example embodiments, the detector and the terahertz optomechanical transducer for transducing an incident electromagnetic wave having a frequency within a terahertz frequency band according to the present description comprise various variants, modifications and improvements that will be obvious to those skilled in the art, it being understood that these various variants, modifications and improvements fall within the scope of the disclosed devices or methods such as defined by the following claims.

The invention claimed is:

1. Detector for terahertz electromagnetic waves comprising:
   at least one first device that collects and transforms an incident electromagnetic wave having a terahertz frequency within a terahertz frequency band into a measurable mechanical response; and
   a detection device for detecting an output signal representative of the measurable mechanical response;
   said first device comprising a first element and an opposite element forming with the first element a capacitive gap;
   said first element being a mechanical resonator having a mechanical resonance frequency and being configured to response mechanically to the action of a force stemming from an electric field,
   said electric field being generated between at least one first electric pole induced in said first element, by first electric charges having a first electrical sign, and at least one second electric pole induced in said opposite element, by second electric charges having a second electrical sign opposite to the first electrical sign,
wherein the first device is a terahertz optomechanical transducer that is a terahertz electromagnetic resonator made at least of metal, the terahertz optomechanical transducer comprising the first element and the opposite element,
the first element and the opposite element each comprising a support layer and an electrically conductive layer that is a metal pattern,
the first element and the opposite element having geometric characteristics and dimensions together:
to define a given terahertz electromagnetic resonance frequency of the terahertz electromagnetic resonator, and
to collect the incident terahertz electromagnetic wave being at the electromagnetic resonance frequency of the terahertz electromagnetic resonator or in the response frequency bandwidth of the terahertz electromagnetic resonator, and to transform the incident terahertz electromagnetic wave into a measurable mechanical response,
the first element mechanically moves or deforms under the effect of the force stemming from the electric field generated by an interaction of the incident terahertz electromagnetic wave on electric charges present in the electromagnetic terahertz resonator and their mutual coupling,
the electric field being generated by the interaction of said incident electromagnetic wave with electric charges in said terahertz electromagnetic resonator, at the terahertz frequency of the incident electromagnetic wave or in the response frequency bandwidth of the terahertz electromagnetic resonator,
wherein the first electric charges and the second electric charges alternate in signs between the first and the second electric poles in time at the terahertz frequency of the incident electromagnetic wave, and
wherein the mechanical resonance frequency of the mechanical resonator is much lower than the electromagnetic resonance frequency of the terahertz electromagnetic resonator the mechanical resonance frequency being in the kHz, MHz, or GHz domain.

2. The detector according to claim 1, wherein the detector comprises modulation means for modulating the intensity of the incident electromagnetic wave at a frequency in a response bandwidth of the mechanical resonator.

3. The detector according to claim 1, wherein the opposite element responds mechanically to the action of the force stemming from the electric field.

4. The detector according to claim 1, wherein the first element and/or the opposite element comprise at least one support layer in semiconductor or dielectric material supporting the electrically conductive layer.

5. The detector according to claim 1, wherein the terahertz electromagnetic resonator is on a substrate, and the first element has a flexible part suspended above the substrate, the flexible part having a movable extremity and a fixed extremity relative to the substrate, or being fixed on two extremities.

6. The detector according to claim 1, wherein the first element is one element from the group consisting of a vibrating arm/bar/beam, a wire, a lever, a membrane, a disk, a plate, a pillar, a post, an array, a torsional system, a ring, a rectangular patch, a circular patch, a bulk-mode mechanical resonator, a contour mode mechanical system, a bulk acoustic wave resonator, a tuning fork, a surface acoustic wave resonator.

7. The detector according to claim 1, wherein multiple pairs of electric poles of opposite signs are generated by the interaction of the incident electromagnetic wave with electric charges in said terahertz electromagnetic resonator, and wherein the terahertz optomechanical transducer comprises at least a second element in which a second pair of electric poles of opposite signs are induced by the action of the incident electromagnetic wave on the electric charges in said terahertz electromagnetic resonator.

8. The detector according to claim 1, wherein the terahertz electromagnetic resonator comprises one continuous electrically-connected part that comprises at least the electrically conductive layer made of metal, the first element and the opposite element forming two opposite ends of said continuous electrically-connected part.

9. The detector according to claim 8, wherein the terahertz electromagnetic resonator comprises at least one split ring.

10. The detector according to claim 8, wherein the terahertz electromagnetic resonator comprises a single split ring comprising the first element and the opposite element.

11. The detector according to claim 1, wherein terahertz electromagnetic resonator comprises at least two continuous electrically-connected parts that are electrically separated, each continuous electrically-connected part presenting each at least one electrically conductive layer made of metal, the first element forming an end of a first continuous electrically-connected part and the opposite element forming an extremity of a second continuous electrically-connected part.

12. The detector according to claim 11, wherein the terahertz electromagnetic resonator comprises a double split ring comprising a single electromagnetic resonance, a first split ring that is a first electrically-connected part of the terahertz electromagnetic resonator and a second split ring that is a second electrically-connected part, of the terahertz electromagnetic resonator, the first element being formed at the end of the first split ring and the opposite element being formed at the end of the second split ring.

13. The detector according to claim 11, wherein the terahertz electromagnetic resonator comprises at least one split ring.

14. The detector according to claim 1, wherein the distance between the first pole and the second pole 5 is between 10 nm and 10 μm.

15. The detector according to claim 3, wherein the detector comprises modulation means for modulating the intensity of the incident electromagnetic wave at a frequency in a response bandwidth of the mechanical resonator.

16. The detector according to claim 1, wherein the electromagnetic force generated by the THz incident electromagnetic wave does not rely on radiation absorption.

17. A method for detecting terahertz electromagnetic waves with a detector according to claim 1, comprising:
transforming an incident electromagnetic wave having a terahertz frequency within a terahertz frequency band of use, into a measurable mechanical response, with a terahertz optomechanical transducer configured by geometric characteristics and dimensions to collect the incident electromagnetic wave, the transducer having a first element and an opposite element forming with the first element a capacitive gap,
the first element and the opposite element each comprising a support layer and an electrically conductive layer that is a metal pattern;

detecting an output signal representative of said mechanical response by the detection device of the detector, the amplitude of the output signal being proportional to the intensity of said incident electromagnetic wave, wherein transforming the incident electromagnetic wave into a measurable mechanical response comprises:

collecting the incident electromagnetic wave by the terahertz optomechanical transducer of the detector;

wherein the terahertz frequency of the incident electromagnetic wave corresponds to the electromagnetic resonance frequency of the terahertz electromagnetic resonator or is in a response bandwidth of the terahertz electromagnetic resonator, producing a mechanical response of the first element by action of a force stemming from an electric field generated by interaction of said electromagnetic wave on electric charges present in said terahertz electromagnetic resonator, wherein said electric field is generated between a first electric pole induced in said first element, by first electric charges having a first electrical sign and a second electric pole induced in said opposite element, by second electric charges having a second electrical sign opposite to the first electrical sign, and wherein the first electric charges and the second electric charges alternate in signs between the first and the second electric poles in time at the terahertz frequency of the incident electromagnetic wave, and wherein the mechanical resonance frequency of the first element is much lower than the electromagnetic resonance frequency of the terahertz electromagnetic resonator.

18. The method according to claim 17, wherein the mechanical response of the first element is a mechanical deformation or a motion of the first element or a piezoelectric strain.

19. The method according to claim 17, wherein the intensity of the incident electromagnetic wave is modulated at a frequency within a response bandwidth of the mechanical resonator.

20. The method according to claim 17, wherein the intensity of the incident electromagnetic wave is modulated at a frequency equal to or near to the mechanical resonance frequency of the mechanical resonator.

21. The method according to claim 17, wherein the first element deforms mechanically to the action of a force only stemming from the electric field generated by interaction of said incident terahertz electromagnetic wave with electric charges in said terahertz electromagnetic resonator.

* * * * *